(12) United States Patent
Ono et al.

(10) Patent No.: US 7,696,522 B2
(45) Date of Patent: Apr. 13, 2010

(54) LIGHT EMITTING DEVICE

(75) Inventors: Masato Ono, Tokushima (JP); Shinya Sonobe, Tokushima (JP); Hiroyuki Ishida, Shizuoka (JP); Tsukasa Tokida, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 72 days.

(21) Appl. No.: 11/223,431

(22) Filed: Sep. 8, 2005

(65) Prior Publication Data

US 2006/0055309 A1    Mar. 16, 2006

(30) Foreign Application Priority Data

Sep. 14, 2004   (JP)   ............ P. 2004-266841

(51) Int. Cl.
*H01L 33/00*   (2006.01)
(52) U.S. Cl. .................. 257/88; 257/E33.001
(58) Field of Classification Search ............ 257/91, 257/88
See application file for complete search history.

(56) References Cited

U.S. PATENT DOCUMENTS

2003/0160256 A1 *  8/2003  Durocher et al. ............. 257/88

FOREIGN PATENT DOCUMENTS

| JP | 2004-080046 | 3/2004 |
| WO | WO 98/05078 | 2/1998 |

* cited by examiner

*Primary Examiner*—Kenneth A Parker
*Assistant Examiner*—Anthony Ho
(74) *Attorney, Agent, or Firm*—Fish & Richardson P.C.

(57)   ABSTRACT

A light emitting device including a light source and a light transforming 101 member containing a fluorescent substance for absorbing at least a part of a light emitted from the light source and for emitting a light having a different wavelength. The light source includes a plurality of semiconductor light emitting units 104, at least a part of which are covered with the light transforming member 101. A shielding member 102 between a first semiconductor light emitting unit 104a covered with the light transforming member 101 and a second semiconductor light emitting unit 104b which is adjacent to the semiconductor light emitting unit 104a.

11 Claims, 5 Drawing Sheets

LIGHT EMITTING DEVICE

TECHNICAL FIELD

The present disclosure relates to a light emitting device using a light emitting unit such as a light emitting diode and a phosphor to be excited by the light emitting unit to emit a light.

BACKGROUND

A light emitting device has been proposed for combining a light emitting unit and a fluorescent substance for absorbing at least a part of a light emitted from the light emitting unit to emit a light having a different wavelength, and emitting a light having a white mixed color. In particular, the light emitting device to be utilized as a light source for illumination includes a plurality of light emitting units to increase the luminance, and furthermore, a phosphor to be excited by the light emitting units is provided in the vicinity of the light emitting unit. Consequently, the wavelength conversion efficiency of the phosphor can be enhanced. For example, a light emitting diode disclosed in Japanese Published Patent Document JP-A-2004-80046 has a red light emitting unit, a blue light emitting unit, and a phosphor to be excited by the blue light emitting unit to emit an emission spectrum for compensating for a light emitting intensity in a wavelength band between a blue wavelength band and a red wavelength band. The phosphor is filled in the cup of a lead frame having the blue light emitting unit and the red light emitting unit mounted thereon and covers the blue light emitting unit and the red light emitting unit. Moreover, one of the electrodes of each of the red light emitting unit and the blue light emitting unit is connected to each of different lead electrodes, and the red light emitting unit or the blue light emitting unit can also be caused to emit a light separately. By such a light emitting diode, consequently, it is possible to obtain a light emitting diode having a high color reproducibility and a high luminous efficiency.

In a light emitting device which can be utilized as an onboard light source, furthermore, a plurality of light emitting units is arranged in such a manner that an irradiated light has a predetermined light distribution pattern, and a light transforming member containing a phosphor is applied to the light emitting units. A predetermined one of the light emitting units is selected and driven so that the selected light emitting unit emits a light and a desirable light distribution pattern formed by a light having a mixed color of the emitted light and the fluorescence of the phosphor is observed.

In some cases in which the light emitting units are provided close to each other, however, light emitted from the driven light emitting unit excites a phosphor applied to another light emitting unit which is not driven. Consequently, light having a mixed color is observed from the region of another light emitting unit which is not driven (this phenomenon will be hereinafter referred to as "pseudo lighting" in this specification). When the pseudo lighting is generated, the contour of the light distribution pattern formed by the irradiation of a light from a light emitting device becomes unclear. In some cases, the size of the light source emitting the mixed color light is increased, which is disadvantageous to the optical design of a light source for a vehicle. The pseudo lighting is thus generated, so that a light emitting device having a desirable optical characteristic cannot be obtained.

Therefore, it would be desirable to provide a light emitting device having an excellent optical characteristic without causing the pseudo lighting.

SUMMARY

A light emitting device according to one aspect of the invention comprises a light source and a light transforming member containing a fluorescent substance for absorbing at least a part of a light emitted from the light source and for emitting alight having a different wavelength. The light source is formed by a plurality of semiconductor light emitting units, at least a part of which are covered with the light transforming member. A shielding member is provided between the semiconductor light emitting unit covered with the light transforming member and a semiconductor light emitting unit that is adjacent to the semiconductor light emitting unit.

The shielding member can reflect or absorb any of the lights emitted from the semiconductor light emitting units in the direction of the light transforming member for covering the adjacent semiconductor unit, and can prevent the emitted light from being incident on the light transforming member for covering the adjacent semiconductor units. Accordingly, the fluorescent substance contained in the light transforming member for covering the semiconductor light emitting unit can be prevented from being excited by the light emitted from a semiconductor light emitting unit that is adjacent to the semiconductor light emitting unit. Consequently, it is possible to obtain a desirable light distribution pattern in which pseudo lighting is prevented.

Moreover, each of the semiconductor light emitting units may have a pair of positive and negative electrodes on the same surface side, and may be mounted on a support substrate having a conductor wiring in such a manner that the positive and negative electrodes are connected to the conductor wiring through a conductive member. Consequently, it is possible to provide a high-power light emitting device in which the heat radiating property of the semiconductor light emitting unit can be enhanced and a desirable light distribution pattern can be obtained.

The shielding member may be constituted by a forming member having a penetrating portion in which the semiconductor light emitting unit is to be fitted. Consequently, it is possible to block the incidence of a light on the light transforming member formed on the adjacent semiconductor light emitting unit.

Furthermore, the shielding member may be applied to cover a side surface of the semiconductor light emitting unit. Consequently, the shielding member adheres to the side surface of the semiconductor light emitting unit and the light is prevented from leaking out of the semiconductor light emitting unit in the direction of a side surface. Therefore, it is possible to further enhance the shielding property of the shielding member.

In addition, the shielding member may be disposed on, or applied to, the support substrate in such a manner that at least an upper surface thereof is provided almost level with a main surface on the light emission observing side of the semiconductor light emitting unit. The shielding member may be provided on, or applied to, the support substrate in such a manner that the upper surface is higher than the main surface on the light emission observing side. Consequently, the shielding property of the shielding member can be enhanced and the shielding member can be prevented from being a shadow in the direction of the light emission of a light having a mixed color. Accordingly, it is possible to obtain a light emitting device in which the shielding member does not adversely influence the light distribution pattern of the light emitting device.

The light transforming member may be provided for covering the main surface on the light emission observing side of the semiconductor light emitting unit. It is possible to obtain a light emitting device in which a variation in a chromaticity caused by a light emission observing azimuth is small and the color of an emitted light is uniform.

Furthermore, the light transforming member can cover the light emitting surface of the semiconductor light emitting unit in a uniform thickness. Consequently, it is possible to obtain a light emitting device having a more uniform chromaticity depending on the light emission observing azimuth.

In addition, the shielding member may cover the side surface of the semiconductor light emitting unit. At a final step in a process for forming the semiconductor unit, the shielding film can be formed by using an ordinary forming method to be utilized for forming the semiconductor unit. For example, the shielding film can be formed by sputtering after the formation of the electrode of the semiconductor unit through the sputtering. Therefore, it is possible to obtain a semiconductor light emitting unit having a shielding member with a high mass productivity.

The shielding member may be a light reflecting layer for covering the side surface of the semiconductor light emitting unit through an insulating member. Consequently, it is possible to obtain a high mass productivity semiconductor light emitting unit having a shielding member.

Furthermore, the shielding member may be obtained by containing a diffusing material in a resin material. Consequently, it is possible to enhance the shielding property of the shielding member.

In addition, the shielding film may be constituted, for example, by an insulating film and a metal film containing at least one metal selected from the group consisting of aluminum, silver and rhodium. Consequently, it is possible to enhance the shielding property of the shielding member.

The shielding member may be constituted by containing a diffusing material or a white pigment in a resin material. The diffusing material may contain at least one material selected from among barium sulfate, barium titanate, titanium oxide, aluminum oxide and silicon oxide. Consequently, the emitted light can be diffused efficiently in the direction of the light transforming member covering the light emitting unit and the light can be prevented from being emitted in the direction of the light transforming member of the adjacent light emitting unit. Accordingly, the shielding property of the shielding member and the luminous efficiency of the light transforming member can be enhanced.

In some implementations, one or more of advantages may be present. For example, it is possible to obtain a light emitting device having an excellent optical characteristic in which pseudo lighting can be suppressed and which includes a light distribution pattern having a clear contour and is excellent in an optical characteristic.

BEST MODE FOR CARRYING OUT THE INVENTION

Examples of embodiments of the invention will be described below in detail with reference to the drawings. The light emitting device according to the invention is not restricted to the following configurations. Moreover, the sizes of members shown in each of the drawings and the relationship between positions are exaggerated in some portions for clarity of the description.

Embodiment 1

Figure 1:
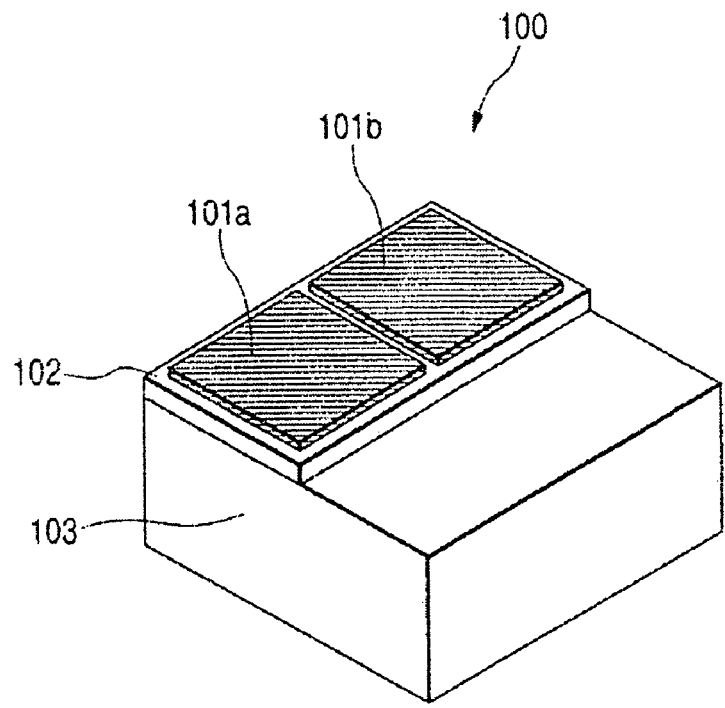
FIG. 1 is a perspective view showing a light emitting device according to a first embodiment of the invention.
Figure 2:
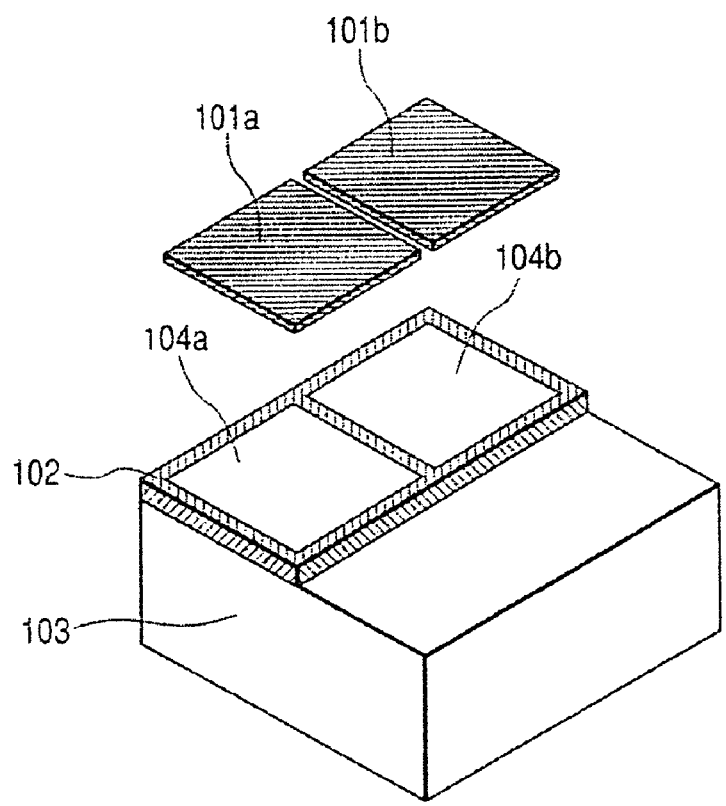
FIG. 2 is an exploded perspective view showing a part in FIG. 1.

FIG. 1 is a perspective view showing a light emitting device according to a first embodiment of the invention, and FIG. 2 is an exploded perspective view showing a part of the light emitting device according to the first embodiment.

In the light emitting device according to the first embodiment, two semiconductor light emitting units $104a$ and $104b$ are mounted in a flip chip configuration on the upper surface of a submount (support substrate) $103$. Light transforming members $101a$ and $101b$ are applied to main surfaces on the light emission observing side of the semiconductor light emitting units $104a$ and $104b$. In the first embodiment, a shielding member $102$ is provided to surround the side surfaces of the two semiconductor light emitting units $104a$ and $104b$, respectively.

In the light emitting device according to the first embodiment, any of the lights emitted from the semiconductor light emitting unit $104a$ in the direction of the light transforming member $101b$ covering the adjacent semiconductor unit $104b$ can be reflected or diffused by the shielding member $102$, and can be prevented from being transmitted in the direction of the light transforming member $101b$ of the adjacent semiconductor light emitting unit $104b$. Accordingly, a fluorescent substance contained in the light transforming member $101b$ covering the semiconductor light emitting unit $104b$ is prevented from being excited by the light emitted from the semiconductor light emitting unit $104a$ that is adjacent to the semiconductor light emitting unit $104b$. The fluorescent substance contained in the light transforming member $101a$ covering the semiconductor light emitting unit $104a$ is not excited by the light emitted from the semiconductor light emitting unit $104b$ that is adjacent to the semiconductor light emitting unit $104a$.

In the light emitting device according to the first embodiment, consequently, it is possible to prevent pseudo lighting, thereby obtaining a desirable light distribution pattern.

In the invention, it is apparent that a part of the semiconductor light emitting units may be covered with the light transforming member. More specifically, the light emitting device may have a semiconductor light emitting unit which is covered with the light transforming member and another semiconductor light emitting unit which is not covered with the light transforming member. Consequently, the light emitting device may be set to obtain light emitted from the fluorescent substance or light having a mixed color in the region of the semiconductor light emitting unit covered with the light transforming member and to obtain a monochromatic light from the light emitting unit in the region which is not covered with the light transforming member. Thus, the invention can produce the advantages described above.

In the light emitting device according to the first embodiment, each of the semiconductor light emitting units has a pair of positive and negative electrodes on the same plane side, and is mounted in a flip chip arrangement on the support substrate 103 having a conductor wiring in such a manner that the positive and negative electrodes are connected to the conductor wiring through a conductive member. Thus, it is possible to obtain a high-power light emitting device in which the heat radiating property of the semiconductor light emitting unit can be enhanced. Furthermore, light is emitted from a surface on the opposite side of a surface having the electrodes. Therefore, the light can be prevented from being intercepted by the electrodes so that a desirable light distribution pattern having a clear contour can be obtained. Moreover, the emitting plane of the semiconductor light emitting unit has no electrode, but instead is flat. Therefore, the light transforming member can be provided in a uniform thickness.

A method of manufacturing the light emitting device according to the first embodiment will be described below.

The support substrate 103, formed of aluminum nitride and provided with a conductor wiring formed of gold (Au), is prepared, for example. The conductor wiring constitutes a pair of positive and negative conductors which are opposed to a p-side seating electrode and an n-side seating electrode of a light emitting unit, respectively.

The light emitting unit is mounted on the support substrate 103 in such a manner that the p-side and n-side seating electrodes are opposed to the conductor wiring through an Au bump, and furthermore, a load, a ultrasonic wave and a heat are applied to weld the bump. At this time, an interval between the semiconductor light emitting units is set to be approximately 100 micron (μm). In the light emitting device according to the first embodiment, the semiconductor light emitting units 104a and 104b are connected through a conductor in such a manner that they can be independently driven respectively, that is, they can emit a light one by one or at the same time.

In the manufacturing method according to the first embodiment, the shielding member 102 is formed around the semiconductor light emitting unit 104 and the light transforming members 101a and 101b are then formed on the main surfaces at the light emission observing sides of the semiconductor light emitting units 104a and 104b, respectively.

More specifically, a silicone resin, a white pigment and a diffusing agent as a material for the shielding member 102 are stirred by means of a rotation/revolution mixer to prepare a mixture of the white pigment, the diffusing agent and the silicone resin. The mixture is applied to the peripheries of the semiconductor light emitting units 104a and 104b by screen printing and is cured. Thus, the shielding member 102 containing the white pigment, the diffusing agent and the silicone resin is formed.

Figure 12:
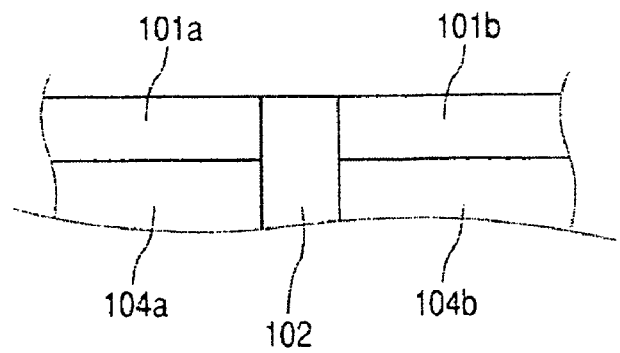
FIG. 12 is a sectional view showing an arrangement of a shielding member according to the invention.

In the first embodiment, the shielding member is formed at a thickness of 100 μm and a width of 100 μm so as to surround the contour of the semiconductor light emitting unit, for example. Whereas the thickness of the welded bump is 20 to 25 μm and the thickness of the semiconductor light emitting unit is approximately 70 μm, the height of the shielding member is set in such a manner that an upper surface thereof is generally positioned on a level with the upper surface (the light emitting surface) of the semiconductor light emitting unit. The upper surface is generally set to be positioned on a level with the upper surface (the light emitting surface) of the semiconductor light emitting unit. Preferably, the upper surface of the shielding member should be higher than the upper surface (the light emitting surface) of the semiconductor light emitting unit as shown in FIG. 12.

In the light emitting device manufactured by the above method, light emitted from the side surface of the light emitting unit 104a is reflected by the shielding member 102 and is irradiated on only the light transforming member 101a covering the light emitting unit 104a. For this reason, the light transforming member 101b covering the light emitting unit 104b is not irradiated.

Second Embodiment

Figure 3:
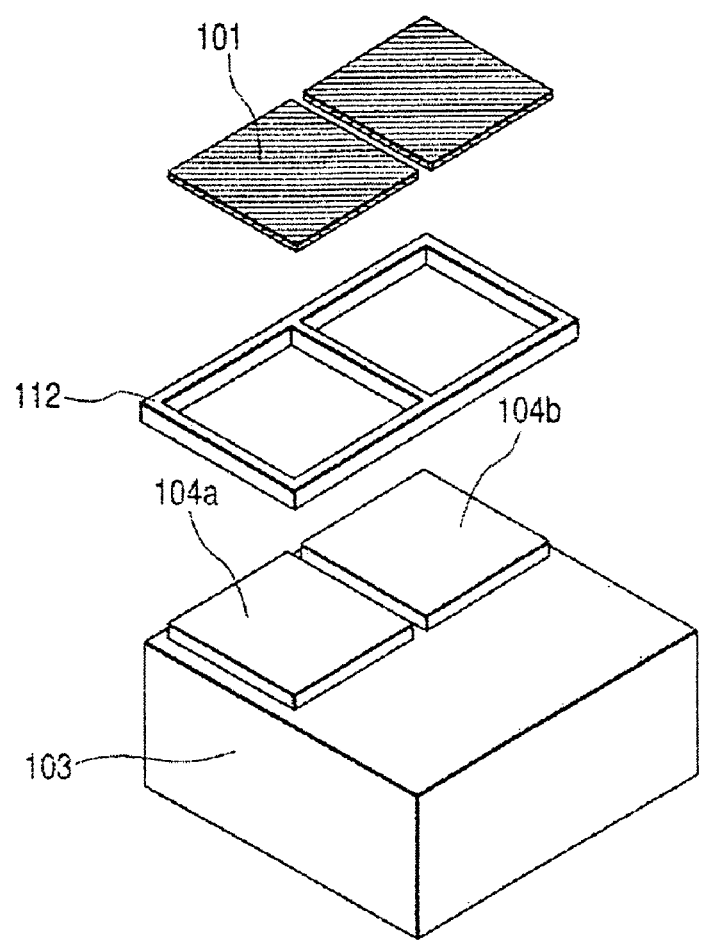
FIG. 3 is a perspective view showing a light emitting device according to a second embodiment of the invention.

FIG. 3 is an exploded perspective view showing the structure of a light emitting device according to a second embodiment of the invention. The light emitting device according to the second embodiment is different from the light emitting device according to the first embodiment in that it is includes a shielding member 112 having penetrating portions for fitting semiconductor light emitting units 104a and 104b therein in place of the shielding member 102 in FIG. 1. More specifically, in the light emitting device according to the second embodiment, the semiconductor light emitting units 104a and 104b are mounted in a flip chip arrangement on the upper surface of the submount 103. The shielding member 112 to serve as a frame member then is provided in such a manner that the semiconductor light emitting units 104a and 104b are fitted in the penetrating portions. The light transforming members 101a and 101b are formed on the main surfaces at the light emission observing side of the semiconductor light emitting units 104a and 104b, respectively. The light emitting device is the same as in the first embodiment except for the foregoing.

The shielding member 112 according to the second embodiment may bes fabricated by carrying out injection molding over a polyphthal amide resin containing a white pigment, for example.

After the shielding member 112 is provided on the submount, the silicone resin containing a phosphor is subjected to screen printing over the semiconductor light emitting units 104a and 104b. At this time, the silicone resin is also provided in a gap between the shielding member 112 and the semiconductor light emitting units 104a and 104b and is cured. Thus, the shielding member 112 is fixed to the submount 103 by a resin material forming the light transforming members 101a and 101b.

The internal wall surface of the penetrating portion of the shielding member 112 is opposed to the side surface of the semiconductor light emitting unit and can reflect a light emitted from the side surface of the semiconductor light emitting unit in the direction of the light transforming member formed on a light emitting surface side thereof. Accordingly, light emitted from the semiconductor light emitting unit 104a is not irradiated on the light transforming member 101b covering the light emitting unit 104b and light emitted from the semiconductor light emitting unit 104b is not irradiated on the light transforming member 101a covering the semiconductor light emitting unit 104a. Consequently, pseudo lighting can be prevented. According to the light emitting device in accordance with the second embodiment, therefore, it is possible to obtain a light emitting device that can prevent the pseudo lighting, has a clear boundary between light distribution patterns and has a high reliability.

Whereas in the second embodiment the semiconductor light emitting units 104a and 104b are mounted and the shielding member (forming member) 112 is attached subsequently, it is also possible to mount the shielding member (forming member) on the support substrate 103 and then to mount the semiconductor light emitting unit to be fitted in the penetrating portion. Moreover, the shielding member may be formed in the direction of the side surface of the semiconductor light emitting unit after the formation of the light transforming member on the main surface at the light emission observing side of the semiconductor light emitting unit or may be mounted to be fitted in the penetrating portion after the formation of the light transforming member on the main surface at the light emission observing side of the semiconductor light emitting unit.

Each of the elements in the light emitting devices according to the first and second embodiments will be described below in more detail.

Shielding Member

The shielding members 102 and 112 according to the first and second embodiments serve to reflect or diffuse the light emitted from the semiconductor light emitting units 104a and 104b, thereby preventing the emitted light from being incident on the light transforming member that covers the other semiconductor light emitting unit.

In some implementations, it is possible to form the shielding member by applying and molding a resin containing a diffusing material onto the side surface of the semiconductor light emitting unit. Screen printing, as described in the first embodiment, or stencil printing may be used. Consequently, it is possible to form the shielding member in a uniform thickness around the semiconductor light emitting unit.

The shielding member can also be obtained by using a metal, a resin or a glass capable of reflecting or diffusing light emitted from the semiconductor light emitting unit and carrying out molding to have a through hole in which the semiconductor light emitting unit is fitted as in the second embodiment. Such a shielding member can be formed by using, a white molding resin, for example, a thermoplastic resin such as a polyphthalamide or polyimide type resin. By containing a white pigment or a diffusing material in the molding resin, alternatively, it is also possible to have a high reflecting function. Furthermore, the wall surface of the shielding member opposed to the side surface of the semiconductor light emitting unit may be tapered. Consequently, it is possible to emit light efficiently from the side surface of the semiconductor light emitting unit in a light emission observing direction.

The shape and size of the penetrating portion of the shielding member may correspond to the external shape of the semiconductor light emitting unit. The thickness of the shielding member may correspond to the thickness of the semiconductor light emitting unit. When the shielding member is mounted on the semiconductor light emitting unit mounted on the support substrate, the upper surface of the shielding member should be positioned almost on a level with at least an upper surface on the light emission observing side of the semiconductor light emitting unit. Consequently, the shielding member is prevented from intercepting a light having a mixed color. Therefore, the optical characteristic of the light emitting device can be prevented from being adversely influenced.

Semiconductor Light Emitting Unit

The semiconductor light emitting units 104a and 104b according to the first and second embodiments are, for example, laser diodes or light emitting diodes that emit light having a wavelength capable of exciting a phosphor. The semiconductor light emitting unit should have a light emitting layer for emitting light at a specific light emitting wavelength capable of exciting the phosphor efficiently.

The material of the semiconductor light emitting unit may include various semiconductors, for example, BN, SiC, ZnSe, GaN, InGaN, InAlGaN, AlGaN, BAlGaN and BInAlGaN. These elements may contain Si or Zn as an impurity element to be the center of light emission. Examples of the material of a light emitting layer capable of efficiently emitting visible light having a short wavelength from an ultraviolet region capable of efficiently exciting a phosphor include nitride semiconductors (for example, $In_XAl_YGa_{1-X-Y}N$ to be a nitride semiconductor containing Al and Ga and a nitride semiconductor containing In and Ga, $0 \leq X$, $0 \leq Y$, $X+Y \leq 1$). Examples of the structure of a semiconductor include a homostructure having an MIS junction, a PIN junction or a pn junction, a hetero structure or a double hetero structure. It is possible to select the wavelength of an emitted light depending on the material of the semiconductor layer or a mixed crystal degree thereof. Moreover, it is possible to employ a single quantum well structure or a multiple quantum well structure in which a semiconductor active layer is formed on a thin film to produce a quantum effect.

If nitride semiconductor is used, a material such as sapphire, spinel, SiC, Si or ZnO may be used as a substrate for the semiconductor. In order to form a nitride semiconductor having excellent crystallinity with a high mass productivity, it is preferable to use a sapphire substrate. The nitride semiconductor on the sapphire substrate may be formed by using an MOCVD method. A buffer layer such as GaN, AlN or GaAlN is formed on the sapphire substrate, and a nitride semiconductor having the pn junction is formed thereon.

Examples of the light emitting unit having the pn junction using the nitride semiconductor including a double hetero structure. Such a double hetero structure may include a first contact layer formed of n-type gallium nitride, a first clad layer formed of n-type aluminum gallium nitride, an active layer formed of indium gallium nitride, a second clad layer formed of p type aluminum gallium nitride and a second contact layer formed of p-type gallium nitride. Those layers are laminated on a buffer layer sequentially.

The nitride semiconductor has an n-type conductivity in a state in which an impurity is not doped. If an n-type nitride semiconductor is to be formed, Si, Ge, Se, Te or C may be introduced as an n-type dopant. On the other hand, if a p-type nitride semiconductor is to be formed, Zn, Mg, Be, Ca, Sr or Ba to be a p-type dopant may be used. The nitride semiconductor is changed to have a p-type with difficulty by doping the p-type dopant. For this reason, it is preferable to reduce the resistance by heating through a furnace or a plasma irradiation after the introduction of the p-type dopant.

A diffusion electrode for spreading a current supplied into the light emitting unit over the whole region of a p-type semiconductor is provided on the p-type semiconductor. The diffusion electrode and the n-type semiconductor are provided with a p-side seating electrode and an n-side seating electrode which are to be connected to a bump or a conductive member such as a conductive wire, respectively.

The p-side and n-side seating electrodes of the semiconductor light emitting unit are electrically connected to a conductive member or a radiating member which may be provided on an insulating member through a conductive wire. Alternatively, the semiconductor light emitting unit is mounted in a flip chip arrangement through solder or a bump, and is connected electrically to a conductive wiring or a lead electrode in a support substrate.

An antireflection film may be provided on the translucent substrate surface of the semiconductor light emitting unit according to the first and second embodiments. Alternatively, the light emission observing surface of the translucent substrate may be roughened. Consequently, it is possible to enhance the light fetch efficiency of the semiconductor light emitting unit which is flip chip mounted. The side surface of the semiconductor light emitting unit may be inclined (tapered) in such a manner that emitted light is reflected in a light emission observing direction. Consequently, it is possible to obtain a semiconductor device having a high light fetch efficiency.

In the light emitting device according to the first and second embodiments, it is also possible to use a semiconductor light emitting unit having another configuration in which counter electrodes are formed on the upper and lower surfaces of the unit. The semiconductor light emitting unit having the counter electrodes is fixed through a conductive adhesive in such a manner that one of the electrodes is opposed to the support substrate 103. More specifically, one of the electrodes of the light emitting unit is electrically connected to the conductor wiring of the support substrate through the conductive adhesive, and the other electrode is connected through a conductive wire to a conductive wiring having a different polarity from the conductor wiring. In this case, examples of the material of the conductive adhesive include an eutectic material such as silver paste (e.g., Au—Sn or Ag—Sn).

The semiconductor light emitting unit having the counter electrode structure can be fabricated in the following manner. First, an n-type nitride semiconductor layer and a p-type nitride semiconductor layer are laminated in the same manner as the semiconductor unit. Then, a p-electrode, which serves as a first electrode, is formed, and an insulating film is formed on the p-electrode and the p-type nitride semiconductor layer. Thereafter, a support substrate to be adhered to the semiconductor layer is prepared. The material of the support substrate may include Cu—W, Cu—Mo, AlN, Si and SiC. A structure having a bonding layer, a barrier layer and an eutectic layer is preferable for the surface to be adhered. For example, a metal film such as Ti—Pt—Au or Ti—Pt—AuSn may be formed. Such a metal film is alloyed by an eutectic and becomes a conductive layer in a subsequent step.

Next, the surface of the support substrate on which the metal film is formed and the surface of the nitride semiconductor layer are opposed to each other and are pressed together. At the same time, heat is applied to make an alloy, and an excimer laser beam is irradiated from the heterogeneous substrate side, or the heterogeneous substrate is removed by grinding. Thereafter, peripheral etching is carried out by RIE to form a nitride semiconductor unit, and a nitride semiconductor unit with a peripheral nitride semiconductor layer removed is obtained. The exposed surface of the nitride semiconductor may be subjected to concavo-convex processing (a dimple processing) by the RIE to enhance the light fetch effect. The concavo-convex portions take the sectional shapes of a mesa type and a reverse mesa type and the planar shapes of an island, a lattice, a rectangle, a circle and a polygon. Next, an n-electrode, which serves as a second electrode, is formed on the exposed surface of the nitride semiconductor layer. Examples of an electrode material include Ti/Al/Ni/Au and W/Al/WPt/Au.

Support Substrate

The support substrate 103 may be a member having a conductor wiring provided on at least an opposed surface to the electrode of the light emitting unit and serving to fix and support the light emitting unit which is mounted. If the support substrate is to be conducted to a lead electrode, a conductor wiring may be provided by a conductive member from the opposed surface to the light emitting unit to an opposed surface to the lead electrode.

A metal for the material of the conductor wiring may be Au or Al to serve as a silver white metal. A silver white metal having a high reflectance is preferable because light emitted from the light emitting unit is reflected in an opposite direction to the support substrate and the light fetch efficiency of the light emitting device can be thus enhanced. The metal to be used for the conductor wiring should be selected in consideration of the adhesive property between metals, that is, wettability. For example, when the electrode of an LED chip containing Au is to be bonded through an Au bump by ultrasonic die bonding, the conductor wiring may be set to be Au or an alloy containing Au.

The material of the support substrate should have a coefficient of thermal expansion which is almost equal to that of the light emitting unit. For example, aluminum nitride may be used for the nitride semiconductor light emitting unit. By using such a material, it is possible to relieve the influence of a thermal stress generated between the support substrate and the light emitting unit. Alternatively, inexpensive silicon capable of serving as an electrostatic protecting unit may be used for the material of the support substrate.

As an example of a submount serving as a protecting unit, an impurity ion may be selectively implanted into the n-type silicon substrate of an Si diode unit to form a p-type semiconductor region, thereby setting a reverse breakdown voltage to be a predetermined voltage. A p-electrode and an n-electrode formed of Al are provided on a p-type semiconductor region and the n-type silicon substrate (n-type semiconductor region) in the Si diode unit, and a part of the p electrode and a part of the n electrode serve as bonding pads, respectively.

It is also possible to form an n-electrode of Au to be electrically connected to the lead electrode of a support substrate such as a package on the lower surface of the n-type silicon substrate without setting a part of the n-electrode to be a bonding pad. Consequently, the n-electrode side can be electrically connected without using a wire.

For the connection of the conductor wiring provided on the support substrate and the electrode of the semiconductor unit, ultrasonic bonding may be carried out by means of a bonding member such as Au, an eutectic material (Au—Sn, Ag—Sn), a solder (Pb—Sn) or a lead-free solder.

Light Transforming Member

A phosphor serves to absorb a part of a visible light or an ultraviolet ray which is discharged from the light emitting unit and to emit light having a wavelength different from the wavelength of the absorbed light. In particular, the phosphor to be used in the first and second embodiments is excited at least by light emitted from the semiconductor light emitting unit, emits light having a converted wavelength, and is fixed by a binder so as to be a light transforming member. For the binder, it is also possible to use, for example, a translucent inorganic material generated by a sol-gel method utilizing a translucent resin such as an epoxy resin or a silicone resin having a high light resistance or metal alkoxide as a starting material.

To apply the light transforming member to the semiconductor light emitting unit, it is possible to use various forming methods such as screen printing, ink jet coating, potting and stencil printing. The light transforming member should cover at least a light emission observing surface in the semiconductor light emitting unit. Alternatively, the light transforming member may be formed through injection molding by causing a glass or a translucent resin to contain a phosphor, for example. In this case, the light transforming member should have a shape so that it can be fitted in the external shape of the semiconductor light emitting unit and cover at least the main surface on the light emission observing side of the semiconductor light emitting unit. Alternatively, the light transforming member may be plate-shaped to cover only the main surface (for example, a translucent substrate surface) on the light emission observing side of the semiconductor light emitting unit which is flip chip mounted. Consequently, the wavelength conversion efficiency of a fluorescent substance can be enhanced. Thus, it is possible to obtain a light emitting device having a uniform chromaticity depending on a light emission observing azimuth. Next, a detailed description is provided for a phosphor which can be contained in the light transforming member.

Aluminum Oxide Type Phosphor

The aluminum oxide type phosphor may be an oxide phosphor that contains Al, and at least one element selected from Y, Lu, Sc, La, Gd, Tb, Eu or Sm and one element selected from Ga or In, that is activated by at least one element selected from rare earth elements, and that is excited by a visible light or an ultraviolet ray emitted from an LED chip to emit light.

As an example, it is possible to take $YAlO_3$:Ce, $Y_3Al_5O_{12}$:Ce, $Y_4Al_2O_9$:Ce, $(Y_{0.8}Gd_{0.2})_3Al_5O_{12}$:Ce, $Y_3(Al_{0.8}Ga_{0.2})_5O_{12}$:Ce, $Tb_{2.95}Ce_{0.05}Al_5O_{12}$, $Y_{2.90}Ce_{0.05}Tb_{0.05}Al_5O_{12}$, $Y_{2.94}Ce_{0.05}Pr_{0.01}Al_5O_{12}$, and $Y_{2.90}Ce_{0.05}Pr_{0.05}Al_5O_{12}$. At least two kinds of yttrium.aluminum oxide type phosphors which contain Y, are activated by Ce or Pr and have different compositions (which are referred to as yttrium.aluminum. garnet type phosphors (hereinafter referred to as "YAG type phosphors", for example) may be used. Because of their high luminanceit is preferable to utilize $(Re_{1-x}Sm_x)_3(Al_{1-y}Ga_y)_5O_{12}$:Ce ($0 \leq x < 1$, $0 \leq y \leq 1$, Re is at least one element selected from the group consisting of Y, Gd and La).

As the $(Re_{1-x}Sm_x)_3(Al_{1-y}Ga_y)_5O_{12}$:Ce phosphor has a garnet structure, it is resistant to heat, light and water content and can set the peak of an excitation spectrum to be in the vicinity of 470 nanometers (nm). Moreover, the same phosphor has a light emission peak in the vicinity of 530 nm and can have a broad emission spectrum trailing up to 720 nm.

In the light emitting device according to the invention, the phosphor may be obtained by mixing two or more kinds of phosphors. More specifically, referring to the YAG type phosphor, it is possible to mix two or more kinds of $(Re_{1-x}Sm_x)_3(Al_{1-y}Ga_y)_5O_{12}$:Ce phosphors having different contents of Al, Ga, Y, La, Gd and Sm, thereby increasing the wavelength component of RGB. The light emitting wavelengths of some semiconductor light emitting units have a variation. Therefore, the two or more kinds of phosphors can be mixed and regulated to obtain a desired light having a white mixed color. The amounts of the phosphors having different chromaticity points may be regulated for containment corresponding to the light emitting wavelength of the light emitting unit. Consequently, an optional point on a chromaticity diagram which is connected to the phosphors through a light emitting unit can be caused to emit a light.

If blue light emitted from a light emitting unit using a nitride type compound semiconductor for a light emitting layer, a green light emitted from a phosphor having a yellow body color because of the absorption of the blue color, and a red light are displayed as a mixed color, it is possible to provide a display with a white light emitting color. The light emitting device can also contain the powder or bulk of a phosphor in various resins such as an epoxy resin, an acrylic resin or a silicone resin or a translucent inorganic substance such as silicon oxide or aluminum oxide to generate a mixed color. Thus, it is possible to utilize a dot-like substance or a layered substance containing the phosphor which is formed thinly to transmit a light emitted from the light emitting unit therethrough. By regulating the ratio of the phosphor to the translucent inorganic substance and the amounts of application and filling, and by selecting the light emitting wavelength of the light emitting unit, it is possible to provide an optional tone such as a bulb color including a white color.

Moreover, it is possible to obtain a light emitting device capable of efficiently emitting a light by providing the two or more kinds of phosphors with respect to a light incident from the light emitting unit in order, respectively. More specifically, it is possible to utilize a reflected light effectively by laminating a color converting member having an absorbing wavelength on a long wavelength side and containing a phosphor capable of emitting a light having a long wavelength and a color converting member having an absorbing wavelength on a longer wavelength side and capable of emitting a light having a longer wavelength on a light emitting unit having a reflecting member.

By using the YAG type phosphor, it is possible to obtain a light emitting device having a sufficient light resistance with a high efficiency even if the YAG type phosphor is provided in contact with or close to a light emitting unit having an irradiance of (Ee)=0.1 W·cm-2 to 1000 W·cm-2.

As the YAG type phosphor capable of emitting a light having a green color which is activated by cerium to be used in the embodiment has a garnet structure, it is resistant to heat, light and water content and can set the peak wavelength of an excitation absorption spectrum in the vicinity of 420 nm to 470 nm. Moreover, it has a broad emission spectrum with a light emitting peak wavelength λp in the vicinity of 510 nm which trails to the vicinity of 700 nm. On the other hand, a YAG type phosphor capable of emitting a light having a red color which is an yttrium.aluminum oxide type phosphor activated by cerium also has the garnet structure and is resistant to heat, light and water content, and can set the peak wavelength of an excitation absorption spectrum in the vicinity of 420 nm to 470 nm. Moreover, it has an emission spectrum with a light emitting peak wavelength λp in the vicinity of 600 nm which trails to the vicinity of 750 nm.

In the composition of the YAG type phosphor having the garnet structure, part of Al may be substituted with Ga so that the emission spectrum is shifted to a short wavelength side, and part of Y in the composition may be substituted with Gd and/or La so that the emission spectrum is shifted to a long wavelength side. By such a change in the composition, it is possible to regulate a luminescent color continuously. Accordingly, there is an ideal condition for carrying out a conversion into a light emission having a white color by utilizing a light emission having a blue color in a nitride semiconductor, that is, an intensity on the long wavelength side can be changed continuously in the composition ratio of Gd. A component having a green color may be large and a component having a red color may be small with the substitution of Y of less than 20%, and the component having a red color is increased and a luminance is rapidly reduced with the substitution of Y of 80% or more. Referring to the excitation absorption spectrum, part of Al in the composition of the YAG type phosphor having the garnet structure may be substituted with Ga so that the excitation absorption spectrum is shifted to a short wavelength side, and part of Y in the composition may be substituted with Gd and/or La so that the excitation absorption spectrum is shifted to a long wavelength side. The peak wavelength of the excitation absorption spectrum of the YAG type phosphor should be set on a shorter wavelength side than the peak wavelength of the emission spectrum of the light emitting unit. With such a structure, if current supplied to the light emitting unit is increased, the peak wavelength of the excitation absorption spectrum is almost coincident with the peak wavelength of the emission spectrum of the light emitting unit. Therefore, it is possible to form a light emitting device which suppresses the generation of a chromaticity deviation without reducing the excitation efficiency of the phosphor.

The aluminum and garnet type phosphor can be manufactured by the following method. In the phosphor, oxides or compounds to be changed easily to oxides at a high temperature may be used as the raw materials of Y, Gd, Ce, La, Al, Sm, Pr, Tb and Ga and are mixed sufficiently in a stoichiometric ratio to obtain the raw materials. Alternatively, a coprecipitated oxide obtained by burning a dissolved solution having rare earth elements of Y, Gd, Ce, La, Sm, Pr and Tb in acid in a stoichiometric ratio which is coprecipitated with oxalic acid, aluminum oxide and gallium oxide are mixed to obtain a mixed material. A proper amount of fluoride such as ammonium fluoride may be mixed as a flux with the mixed material and the mixture is filled in a crucible, and is burned for 2 to 5 hours within a range of a temperature of 1350 to 1450° C. in the air to obtain a burned product. Subsequently, the burned product is ground by means of a ball mill in the water and is washed, separated, dried and sieved so that the aluminum and garnet type phosphor can be obtained. In a phosphor manufacturing method according to another embodiment, burning may be carried out in two stages, that is, a first burning step of burning a mixture constituted by a mixed material obtained by mixing the raw materials of the phosphor with a flux in the air or a weak reducing atmosphere and a second burning step to be carried out in a reducing atmosphere.

The weak reducing atmosphere is set to contain at least oxygen in a necessary amount in a reacting process for forming a desired phosphor from the mixed material. The first burning step is carried out until formation of the structure of a desired phosphor is completed in the weak reducing atmosphere so that a change into a black color of the phosphor can be prevented and the light absorption efficiency can be prevented from being reduced. The reducing atmosphere in the second burning step may be stronger than the weak reducing atmosphere. When the burning is carried out in the two stages, a phosphor having a high excitation wavelength absorption efficiency can be obtained. If a light emitting device is obtained by the phosphor thus formed, it is possible to decrease the amount of a phosphor required for obtaining a desirable tone. Thus, it is possible to form a light emitting device having a high light fetch efficiency.

The aluminum and garnet type phosphors activated by cerium of at least two types having different compositions may be mixed or provided independently, respectively. If the phosphors are to be independently provided respectively, it is preferable that a phosphor capable of easily absorbing a light emitted from a light emitting unit on a shorter wavelength side and emitting a light and a phosphor capable of easily absorbing a light on a longer wavelength side and emitting a light should be provided sequentially. Consequently, it is possible to absorb and emit a light efficiently.

It is also possible to utilize a phosphor obtained by combining an aluminum oxide type phosphor represented by an yttrium.aluminum.garnet type phosphor or a ruthenium.aluminum.garnet type phosphor and a phosphor capable of emitting a light having a red color, particularly, a nitride type phosphor. The YAG type phosphor and the nitride type phosphor may be mixed and contained in the light transforming member or may be contained separately in the light transforming member constituted by a plurality of layers. The respective phosphors will be described below in detail.

Ruthenium.Aluminum Oxide Type Phosphor

The ruthenium.aluminum oxide type phosphor is expressed in a general formula $(Lu_{1-a-b}RaMb)_3(Al_{1-c}Ga_c)_5O_{12}$ (R is at least one kind of rare earth element in which Ce is essential; M is at least one kind of element selected from Sc, Y, La and Gd, $0.0001 \leq a \leq 0.5$, $0 \leq b \leq 0.5$, $0.0001 \leq a+b < 1$, and $0 \leq c \leq 0.8$ are set). For example, the ruthenium.aluminum oxide type phosphor is expressed in a compositional formula of $(Lu_{0.99}Ce_{0.01})_3Al_5O_{12}$, $(Lu_{0.90}Ce_{0.10})_3Al_5O_{12}$, and $(Lu_{0.99}Ce_{0.01})_3(Al_{0.5}Ga_{0.5})_5O_{12}$.

The ruthenium.aluminum.garnet type phosphor having the garnet structure in the ruthenium.aluminum oxide type phosphor (which will be hereinafter referred to as an "LAG type phosphor") may be obtained in the following manner. A ruthenium compound, a compound of a rare earth element R, a compound of a rare earth element M, an aluminum compound and a gallium compound may be used as the raw materials of the phosphor, are weighed and taken to have the ratio in the general formula for each of the compounds, and are mixed. Alternatively, a flux is added to the raw materials of the phosphor and they are mixed so that a raw material mixture is obtained. After the raw material mixture is filled in the crucible, is burned at 1200 to 1600° C. in a reducing atmosphere and is cooled, it is dispersed so that the phosphor according to the embodiment which is expressed in the general formula can be obtained.

For the raw materials of the phosphor, a compound such as an oxide, a carbonate changed into an oxide by thermal decomposition or a hydroxide may be used. For the raw materials of the phosphor, it is also possible to use a coprecipitated substance containing all or a part of metal elements constituting the phosphor. For example, when an aqueous solution such as an alkali or a carbonate is added to an aqueous solution containing these elements, the coprecipitated substance is obtained and can be used by drying or thermal decomposition. Moreover, a fluoride or a borate is preferable for a flux and may be added within a range of 0.01 to 1.0 part by weight with respect to 100 parts by weight of the raw materials of the phosphor. A reducing atmosphere in which cerium to be an activator is not oxidized is preferable for a burning atmosphere. A mixed gas atmosphere containing hydrogen and nitrogen in a hydrogen concentration of 3.0% by volume or less also may be used. The burning temperature should be 1200 to 1600° C., and a phosphor having a target central particle size can be obtained. Preferably, the burning temperature should be 1300 to 1500° C.

In the general formula, R represents an activator and at least one rare earth element in which Ce is essential, and more specifically, Ce, La, Pr, Nd, Sm, Eu, Gd, Tb, Dy, Ho, Er, Tm, Yb or Lr. R may be only Ce and may contain at least one element selected from Ce and the rare earth elements other than Ce. The rare earth elements other than Ce serve to act as a coactivator. It is preferable that R should contain Ce in 70 mol % or more with respect to a total amount of R. It is preferable that an "a" value (R amount) should be $0.0001 \leq a \leq 0.5$. Light emission luminance may be reduced if the "a" value is smaller than 0.0001, and may be reduced by concentration quenching even if the "a" value is greater than 0.5. The "a" value may be, for example, $0.001 \leq a \leq 0.4$ and preferably $0.005 \leq a \leq 0.2$. A "b" value (M amount) may be, for example, $0 \leq b \leq 0.5$, and preferably $0 \leq b \leq 0.4$, or $0 \leq b \leq 0.3$. For example, if M is Y, a light emission luminance may be reduced greatly due to an ultraviolet ray having a long wavelength to a visible light having a short wavelength, particularly, 360 to 410 nm excitation when the "b" value is greater than 0.5. A "c" value (Ga amount) may be, for example, $0 \leq c \leq 0.8$, and preferably $0 \leq c \leq 0.5$, or $0 \leq c \leq 0.3$. When the "c" value is greater than 0.8, light emission wavelength may be shifted to a short wavelength so that the light emission luminance is reduced.

The central particle size of the LAG type phosphor may be, for example, 1 to 100 μm, and preferably 5 to 50 μm, or 5 to 15 μm. A phosphor having a smaller central particle size than 1 μm tends to form an aggregate. On the other hand, a phosphor having a particle size range of 5 to 50 μm has a high light absorption ratio and transformation efficiency and easily forms a light transforming member. By containing a phosphor with a great particle size having an optically excellent feature, it is also possible to enhance the mass productivity of the light emitting device. Moreover, the phosphor having the central particle size value may be contained with a high frequency. The frequency value is preferably 20% to 50%. By using a phosphor having a small variation in the particle size, it is possible to obtain a light emitting device having an excellent tone in which a color unevenness can be suppressed.

Since the ruthenium aluminum oxide type phosphor is efficiently excited by an ultraviolet ray or a visible light in a wavelength region of 300 nm to 550 nm and emits light, it can be utilized effectively as a phosphor contained in the light transforming member. By using multiple kinds of LAG type phosphors or LAG type phosphors having different composition formulas together with other phosphors, it is possible to change the luminescent colors of the light emitting device. The conventional light emitting device for emitting a light having a white mixed color by a mixed color of a blue light emitted from the semiconductor light emitting unit and a light emitted from a phosphor for absorbing the emitted light and emitting a light having a yellow color transmits and utilizes a part of the light emitted from the light emitting unit. Therefore, the structure itself can be simplified and the output can be enhanced easily. On the other hand, since the light emitting device emits light having a mixed color of two colors, it has an insufficient color rendering property and needs to be improved. Therefore, the light emitting device for emitting a light having a white mixed color by utilizing the LAG type phosphor may be able to enhance its color rendering property better than the conventional light emitting device. Moreover, the LAG type phosphor may have a better temperature characteristic as compared with the YAG type phosphor. Therefore, it is possible to obtain a light emitting device having a small deterioration and color unevenness.

Nitride Type Phosphor

The phosphor to be utilized in the invention may contain N, and at least one element selected from Be, Mg, Ca, Sr, Ba and Zn and at least one element selected from C, Si, Ge, Sn, Ti, Zr and Hf. A nitride type phosphor activated by at least one element selected from rare earth elements can also be used.

The nitride type phosphor can emit light having a red color, and absorbs a visible light, an ultraviolet ray or lights emitted from other phosphors (for example, the YAG type phosphor) and is thus excited to emit light. In other words, the nitride type phosphor absorbs a part of the light emitted from the light emitting unit (for example, a blue light) and emits light in a yellow to red region. An emission spectrum for exciting the nitride type phosphor may be, for example, 360 to 495 nm. Furthermore, it is preferable to have an emission spectrum in the vicinity of 440 to 480 nm. The emission spectrum of the nitride type phosphor may have a peak wavelength in the vicinity of 560 to 700 nm or in the vicinity of 600 to 680 nm. For example, it is possible to take $Sr_2Si_5N_8$:Eu, Pr, $Ba_2Si_5N_8$:Eu, Pr, $Mg_2Si_5N_8$:Eu, Pr, $Zn_2Si_5N_8$:Eu, Pr, $SrSi_7N_{10}$:Eu, Pr, $BaSi_7N_{10}$:Eu, Ce, $MgSi_7N_{10}$:Eu, Ce, $ZnSi_7N_{10}$:Eu, Ce, $Sr_2Ge_5N_8$:Eu, Ce, $Ba_2Ge_5N_8$:Eu, Pr, $Mg_2Ge_5N_8$:Eu, Pr, $Zn_2Ge_5N_8$:Eu, Pr, $SrGe_7N_{10}$:Eu, Ce, $BaGe_7N_{10}$:Eu, Pr, $MgGe_7N_{10}$:Eu, Pr, $ZnGe_7N_{10}$:Eu, Ce, $Sr_{1.8}Ca_{0.2}Si_5N_8$:Eu, Pr, $Ba_{1.8}Ca_{0.2}Si_5N_8$:Eu, Ce, $Mg_{1.8}Ca_{0.2}Si_5N_8$:Eu, Pr, $Zn_{1.8}Ca_{0.2}Si_5N_8$:Eu, Ce, $Sr_{0.8}Ca_{0.2}Si_7N_{10}$:Eu, La, $Ba_{0.8}Ca_{0.2}Si_7N_{10}$:Eu, La, $Mg_{0.8}Ca_{0.2}Si_7N_{10}$:Eu, Nd, $Zn_{0.8}Ca_{0.2}Si_7N_{10}$:Eu, Nd, $Sr_{0.8}Ca_{0.2}Ge_7N_{10}$:Eu, Tb, $Ba_{0.8}Ca_{0.2}Ge_7N_{10}$:Eu, Tb, $Mg_{0.8}Ca_{0.2}Ge_7N_{10}$:Eu, Pr, $Zn_{0.8}Ca_{0.2}Ge_7N_{10}$:Eu, Pr, $Sr_{0.8}Ca_{0.2}Si_6GeN_{10}$:Eu, Pr, $Ba_{0.8}Ca_{0.2}Si_6GeN_{10}$:Eu, Pr, $Mg_{0.8}Ca_{0.2}Si_6GeN_{10}$:Eu, Y, $Zn_{0.8}Ca_{0.2}Si_6GeN_{10}$:Eu, Y, $Sr_2Si_5N_8$:Pr, $Ba_2Si_5N_8$:Pr, $Sr_2Si_5N_4$:Tb, and $BaGe_7N_{10}$:Ce. Others also may be used. It is preferable that at least one of Y, La, Ce, Pr, Nd, Gd, Tb, Dy, Ho, Er and Lu should be used as the rare earth element in the nitride phosphor, and Sc, Sm, Tm or Yb may be used. These rare earth elements are mixed in a raw material in a state of an oxide, imide or amide in addition to a simple substance. By using Mn, it is possible to increase a particle size and to enhance a light emitting luminance.

In particular, the phosphor is Sr—Ca—Si—N:Eu, Ca—Si—N:Eu, Sr—Si—N:Eu, Sr—Ca—Si—O—N:Eu, Ca—Si—O—N:Eu or Sr—Si—O—N:Eu type silicon nitride to which Mn may be added. The fundamental constitutional element of the phosphor is expressed in a general formula of $L_xSi_yN_{(2/3X+4/3Y)}$:Eu or $L_xSi_yO_zN_{(2/3X+4/3Y-2/3Z)}$:Eu (L is Sr, Ca, or Sr and Ca). In the general formula, X and Y are preferably set to be X=2 and Y=5 or X=1 and Y=7 and can also be set optionally. More specifically, for the fundamental constitutional element, it is preferable to use a phosphor expressed in $(Sr_XCa_{1-X})_2Si_5N_8$:Eu, $Sr_2Si_5N_8$:Eu, $Ca_2Si_5N_8$:Eu, $Sr_XCa_{1-X}Si_7N_{10}$:Eu, $SrSi_7N_{10}$:Eu, or $CaSi_7N_{10}$:Eu to which Mn is added. The composition of the phosphor may contain at least one selected from the group consisting of Mg, Sr, Ca, Ba, Zn, B, Al, Cu, Mn, Cr and Ni. L is Sr, Ca, or Sr and Ca. The compounding ratio of Sr and Ca can be changed as desired. By using Si for the composition of the phosphor, it is possible to provide an inexpensive phosphor having an excellent crystallinity.

The phosphor uses $Eu^{2+}$ as an activator for alkaline earth metal type silicon nitride to be a parent. Mn as an additive promotes the diffusion of $Eu^{2+}$ and enhances the emission efficiency such as light emitting luminance, energy efficiency or quantum efficiency. Mn may be contained in a raw material or a simple Mn substance, or a Mn compound may be contained and burned together with a raw material in a manufacturing process.

The phosphor may contain at least one selected from the group consisting of Mg, Ga, In, Li, Na, K, Re, Mo, Fe, Sr, Ca, Ba, Zn, B, Al, Cu, Mn, Cr, O and Ni in a fundamental constitutional element or together with the fundamental constitutional element. These elements have the function of increasing a particle size or enhancing a light emitting luminance. Moreover, B, Al, Mg, Cr and Ni have a function capable of suppressing an afterglow.

Such a nitride type phosphor absorbs part of the light emitted from the light emitting unit and emits light in a yellow to red region. The nitride type phosphor may be used together with the YAG type phosphor to provide a light emitting device for emitting a light having a warm color type white mixed color by mixing a light emitted from the light emitting unit and a light having a color of yellow to red which is emitted from the nitride type phosphor. In addition to the nitride type phosphor, it is preferable that the phosphor to be added should contain an aluminum.garnet type phosphor. A reason for the aluminum.garnet type phosphor is to facilitate regulation to a desired chromaticity. For example, an yttrium.aluminum oxide fluorescent substance activated by cerium absorbs part of the light emitted from the light emitting unit and emits light in a yellow region. Light having a white mixed color is emitted by mixing the light emitted from the light emitting unit and the yellow light of the yttrium.aluminum oxide fluorescent substance. Accordingly, the yttrium.aluminum oxide fluorescent substance and a phosphor for emitting a light having a red color may be mixed together in a light transforming member having a light permeability, and a blue light emitted from the light emitting unit or a blue light having a wavelength converted by a phosphor may be combined so that a light emitting device for emitting a white light can be provided. A white light emitting device having a chromaticity positioned on the locus of a black body radiation in a chromaticity diagram is particularly preferable. In order to provide a light emitting device having a desired color temperature, it is also possible to change the amount of the phosphor of the yttrium.aluminum oxide fluorescent substance and the amount of a phosphor for emitting a red light. The light emitting device for emitting a light having a white mixed color improves a special color rendering estimation number R9. In a white light emitting device obtained by only a combination of a conventional blue light emitting unit and an yttrium aluminum oxide fluorescent substance activated by cerium, the special color rendering estimation number R9 is approximately zero in the vicinity of a color temperature of Tcp=4600K and a red component is insufficient. For this reason, an increase in the special color rendering estimation number R9 is a problem to be solved. By using a phosphor for emitting a red light together with the yttrium.aluminum oxide fluorescent substance, it is possible to increase the special color rendering estimation number R9 to the vicinity of 40 in the vicinity of the color temperature of Tcp=4600K.

Next, a description will be given for a method of manufacturing a phosphor (($Sr_XCa_{1-X}$)$_2Si_5N_8$:Eu) containing Mn and O. The invention is not restricted to this manufacturing method.

A simple substance may be used with Sr and Ca as the raw materials. A compound such as an imide compound or an amide compound can also be used. Moreover, the raw materials Sr and Ca may contain B, Al, Cu, Mg, Mn, MnO, $Mn_2O_3$ and $Al_2O_3$. Sr and Ca as the raw materials are ground in a gloved box in an argon atmosphere. It is preferable that Sr and Ca obtained by the grinding should have an average particle size of approximately 0.1 μm to 15 μm, although the size is not limited to that range. To improve a mixing state, at least one metal, Ca, Sr or Eu, is brought into an alloy state and then is nitrided and ground, and can be used as a raw material.

While it is preferable that a simple substance such as Si should be used as the raw material, it is also possible to use a nitride compound, an imide compound and an amide compound. For example, $Si_3N_4$, $Si(NH_2)_2$ and $Mg_2Si$ can be taken. The purity of Si as the raw material is preferably equal to or higher than 3N. It is also possible to use a compound such as $Al_2O_3$, Mg, metal boride ($CO_3B$, $Ni_3B$, CrB), manganese oxide, $H_3Bo_3$, $B_2O_3$, $Cu_2O$ or CuO. Si is also ground in the gloved box in the argon atmosphere or the nitrogen atmosphere in the same manner as Sr and Ca to be the raw materials. It is preferable that the Si compound should have an average particle size of approximately 0.1 μm to 15 μm.

Next, Sr and Ca are nitrided in the nitrogen atmosphere. Sr and Ca may be mixed and nitrided or may be nitrided individually. Consequently, a nitride of Sr or Ca can be obtained. Moreover, Si to be the raw material is nitrided in the nitrogen atmosphere. Consequently, silicon nitride can be obtained.

The nitride of Sr, Ca or Sr—Ca is ground. The nitride of Sr, Ca or Sr—Ca is ground in the gloved box in the argon atmosphere or the nitrogen atmosphere. Similarly, the nitride of Si is ground. In the same manner, moreover, a compound of Eu, that is, $Eu_2O_3$ is ground. While europium oxide may be used for the compound of Eu, metal europium and europium nitride can also be used. In addition, an imide compound and an amide compound can be used for Z to be a raw material. While it is preferable that the europium oxide should have a high purity, lower purity europium oxide on the market can also be used. It is preferable that an alkaline earth metal nitride obtained after the grinding, the silicon nitride and the europium oxide should have average particle sizes of approximately 0.1 μm to 15 μm.

The raw material may contain at least one selected from the group consisting of Mg, Sr, Ca, Ba, Zn, B, Al, Cu, Mn, Cr, O and Ni. It is also possible to regulate a compounding amount and to mix the element such as Mg, Zn or B at the following mixing step. Although these compounds can also be added into the raw material individually, they typically are added in the configuration of a compound. The compound of this type includes $H_3BO_3$, $Cu_2O_3$, $MgCl_2$, MgO.Cao, $Al_2O_3$, metal boride (CrB, $Mg_3B_2$, $AlB_2$, MnB), $B_2O_3$, $Cu_2O$ and CuO.

After the grinding is carried out, the nitride of Sr, Ca or Sr—Ca, the nitride of Si and the compound of Eu, that is, $Eu_2O_3$ are mixed, and Mn is added. These mixtures are easily oxidized. For this reason, the mixing is carried out in the gloved box in the Ar atmosphere or the nitrogen atmosphere.

Finally, the mixture of the nitride of Sr, Ca or Sr—Ca, the nitride of Si and the compound of Eu, that is, $Eu_2O_3$ is burned in an ammonium atmosphere. By the burning, it is possible to obtain a phosphor expressed in ($Sr_XCa_{1-X}$)$_2Si_5N_8$:Eu to which Mn is added. By changing the compounding ratio of each raw material, it is possible to change the composition of a phosphor as desired.

For the burning, it is possible to use a tubular furnace, a small-sized furnace, a high-frequency furnace or a metal furnace. Although the burning can be carried out at a burning temperature of 1200 to 1700° C., a burning temperature of 1400 to 1700° C. is preferable. For the burning, it is preferable to use one-stage burning for gradually raising a temperature to carry out the burning for several hours at 1200 to 1500° C., and it is also possible to use two-stage burning (multistage burning) for performing the burning in a first stage at 800 to 1000° C. and gradually carrying out heating to perform the burning in a second stage at 1200 to 1500° C. It is preferable that the burning should be carried out by using a crucible formed of boron nitride (BN) and a boat for the raw material of the phosphor. In addition to the crucible formed of the boron nitride, it is also possible to use a crucible formed of alumina ($Al_2O_3$).

By using the manufacturing method, it is possible to obtain a desired phosphor. Although a nitride type phosphor may be used as a phosphor for emitting a reddish light in the example of the invention, it is also possible to provide a light emitting device comprising the YAG type phosphor and a phosphor capable of emitting a light having a red color. Such a phosphor capable of emitting a light having a red color is excited by a light having a wavelength of 400 to 600 nm, thereby emitting a light, and it is possible to take, as an example, $Y_2O_2S$:Eu, $La_2O_2S$:Eu, Cas:Eu, SrS:Eu, ZnS:Mn, ZnCdS:Ag, Al, ZnCdS:Cu and Al. By using the phosphor capable of emitting a light having a red color together with the YAG type phosphor, thus, it is possible to enhance the color rendering property of the light emitting device.

At least two kinds of phosphors capable of emitting a light having a red color which are represented by the aluminum-.garnet type phosphor formed as described above and the nitride type phosphor may be present in a light transforming member formed by one layer around the light emitting unit or at least one kind of phosphor may be present in a light transforming member formed by two layers. With such a structure, it is possible to obtain light having a mixed color by mixing the colors of lights emitted from different kinds of phosphors. In this case, it is preferable that the average particle sizes and shapes of the phosphors should be similar to each other in order to mix the colors of the lights emitted from the fluorescent substances better and to decrease a color unevenness. Moreover, it is preferable to form the light transforming member in such a manner that the nitride type phosphor is placed in a close position to the light emitting unit from the YAG type phosphor in consideration of the fact that a part of the light having the wavelength converted is absorbed by the YAG type phosphor. By such a structure, a part of the light having a wavelength converted by the YAG phosphor can be prevented from being absorbed into the nitride type phosphor. As compared with the case in which the YAG type phosphor and the nitride type phosphor are mixed and contained, it is possible to enhance the color rendering property of the light having a mixed color more greatly.

Oxynitride Type Phosphor

In addition to the fluorescent substance described above, the fluorescent substance can contain an oxynitride phosphor expressed in the following general formula:

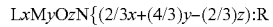

wherein L has at least one element selected from the group consisting of Be, Mg, Ca, Sr, Ba and Zn, and M has at least one element selected from the group consisting of C, Si, Ge, Sn, Ti, Zr and Hf. N represents nitrogen, O represents oxygen, and R represents a rare earth element. x, y and z satisfy the following numeric values.

$x=2, 4.5 \leq y \leq 6, 0.01<z<1.5$, $x=1, 6.5 \leq y \leq 7.5, 0.01<z<1.5$ or $x=1, 1.5 \leq y \leq 2.5, 1.5 \leq z \leq 2.5$ A description will be given for a method of manufacturing an oxynitride phosphor. However, the invention is not restricted to the following manufacturing method. First, a nitride of L, a nitride and oxide of M, and an oxide of a rare earth element are mixed as raw materials to obtain a predetermined compounding ratio. By changing the compound ratio of each of the raw materials, it is possible to vary the composition of a phosphor as desired.

Next, the mixture of the raw materials is put in a crucible to carry out burning. For the burning, it is possible to use a tubular furnace, a small-sized furnace, a high-frequency furnace and a metal furnace. A burning temperature is not particularly restricted but the burning is preferably carried out at a burning temperature of 1200 to 1700° C. and more preferably at a burning temperature of 1400 to 1700° C. It is preferable that the raw material of the phosphor should be burned by using a crucible formed of boron nitride (BN) and a boat. In addition to the crucible formed of the boron nitride, it is also possible to use a crucible formed of alumina ($Al_2O_3$). Moreover, it is preferable that the burning should be carried out in a reducing atmosphere. The reducing atmosphere includes a nitrogen atmosphere, a nitrogen-hydrogen atmosphere, an ammonia atmosphere, or an inert gas atmosphere such as argon. By using the manufacturing method described above, it is possible to obtain an oxynitride phosphor to be intended.

Alkaline Earth Metal Silicate

The light emitting device can have alkaline earth metal silicate activated by europium as a phosphor for absorbing part of the light emitted from the light emitting unit and for emitting light having a different wavelength from the wavelength of the absorbed light. The alkaline earth metal silicate can set a light in a blue color region to be an excitation light and a light emitting device for emitting a light having a warm mixed color can be obtained. It is preferable that the alkaline earth metal silicate should be alkaline earth metal orthosilicate expressed in the following general formula:

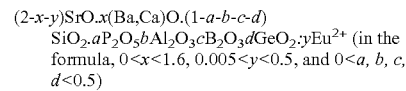

(2-x-y)SrO.x(Ba,Ca)O.(1-a-b-c-d)
 $SiO_2.aP_2O_5bAl_2O_3cB_2O_3dGeO_2$:$yEu^{2+}$ (in the formula, 0<x<1.6, 0.005<y<0.5, and 0<a, b, c, d<0.5)

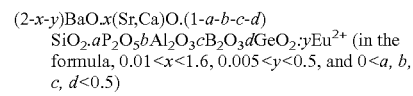

(2-x-y)BaO.x(Sr,Ca)O.(1-a-b-c-d)
 $SiO_2.aP_2O_5bAl_2O_3cB_2O_3dGeO_2$:$yEu^{2+}$ (in the formula, 0.01<x<1.6, 0.005<y<0.5, and 0<a, b, c, d<0.5)

Preferably, at least one of the values of a, b, c and d is greater than 0.01.

The light emitting device can also have, as a phosphor formed of an alkaline earth metal salt, alkaline earth metal aluminate activated by europium and/or manganese, Y(V, P, Si)$O_4$:Eu or alkaline earth metal-magnesium-disilicate expressed in the following formula in addition to the alkaline earth metal silicate.

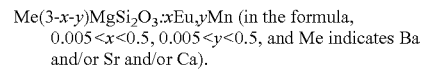

Me(3-x-y)MgSi$_2$O$_3$:xEu,yMn (in the formula,
 0.005<x<0.5, 0.005<y<0.5, and Me indicates Ba and/or Sr and/or Ca).

Next, a description will be given for a process for manufacturing a phosphor formed of the alkaline earth metal silicate.

To manufacture the alikaline earth metal silicate, the stoichiometric amounts of alkaline earth metal carbonate to be a starting substance, silicon dioxide and europium oxide are mixed densely corresponding to a selected composition and the mixture is converted into a desired phosphor at a temperature of 1100° C. and 1400° C. in a reducing atmosphere through a regular solid reaction for the manufacture of the phosphor. In this case, it is preferable that ammonium chloride or other halides in a volume of less than 0.2 mol should be added. Moreover, a part of silicon can also be substituted with germanium, boron, aluminum or phosphorus and a part of europium can also be substituted with manganese if necessary.

By combining the phosphor, that is, one of alkaline earth metal aluminate activated with europium and/or manganese, Y(V, P, Si)$O_4$:Eu and $Y_2O_2S$:$Eu^{3+}$ or these phosphors, it is possible to obtain a luminescent color having a desired color temperature and a high color reproducibility.

Other Phosphor

It is also possible to use a phosphor excited by light in an ultraviolet to visible region to emit light. The following phosphor is a specific example.

(1) An alkaline earth halogen apatite phosphor activated by Eu, Mn, or Eu and Mn; a phosphor such as $M_5(PO_4)_3(Cl, Br):Eu$ (M is at least one selected from Sr, Ca, Ba and Mg), $Ca_{10}(PO_4)_6ClBr:Mn$, or Eu.

(2) An alkaline earth aluminate phosphor activated by Eu, Mn, or Eu and Mn; a phosphor such as $BaMg_2Al_{16}O_{27}$ Eu, $BaMg_2Al_{16}O_{27}:Eu$, Mn, $Sr_4Al_{14}O_{25}:Eu$, $SrAl_2O_4:Eu$, $CaAl_2O_4:Eu$, $BaMgAl_{10}O_{17}:Eu$, $BaMgAl_{10}O_{17}:Eu$, or Mn.

(3) A rare earth acid sulfate phosphor activated by Eu:a phosphor such as $La_2O_2S:Eu$, $Y_2O_2S:Eu$, or $Gd_2O_2S:Eu$.

(4) $(Zn, Cd)S:Cu$, $Zn_2GeO_4:Mn$, $3.5 MgO.0.5 MgF_2 GeO_2:Mn$, $Mg_6As_2O_{11}:Mn$, $(Mg, Ca, Sr, Ba)Ga_2S_4:Eu$, $Ca_{10}(PO_4)_6FCl:Sb$, or Mn.

Diffusing Agent

A diffusing agent may be included in the light transforming member in addition to the fluorescent substance. The diffusing agent also may be contained in the shielding member. For a specific diffusing agent, it is possible to use barium titanate, titanium oxide, aluminum oxide, silicon oxide or their mixtures. Consequently, it is possible to obtain a light emitting device having an excellent directional characteristic.

The diffusing agent may have a central particle size, for example, which is equal to or greater than 1 nm and is smaller than 5 μm. The diffusing agent having a central particle size which is equal to or greater than 1 μm and is smaller than 5 μm irregularly reflects light from a fluorescent substance well and can prevent a color unevenness from being generated easily by using a fluorescent substance having a large particle size, which is preferable. On the other hand, the diffusing agent having a central particle size which is equal to or greater than 1 nm and is smaller than 1 μm has a low interference effect with the wavelength of a light emitted from the light emitting unit, while it is possible to increase a resin viscosity without reducing a luminous intensity. If a resin containing a fluorescent substance is dropped into a desired place to form a light transforming member, it is possible to disperse the fluorescent substance in the resin almost uniformly in a syringe, thereby maintaining the condition. Also when a fluorescent substance having a large particle size which is comparatively hard to handle is used, it is possible to produce the light transforming member with a high yield. Thus, the diffusing agent according to the invention has different actions depending on the range of a particle size and can be used in a selection or a combination corresponding to a method to be utilized.

Filler

It is also possible to include a filler in addition to the fluorescent substance in the light transforming member. The filler also may be included in the shielding member. Consequently, it is possible to enhance the heat-resisting shocking property and heat radiating property of each member.

A specific material is the same as the diffusing agent and has a different central particle size from the diffusing agent. The filler may have a central particle size which is equal to or greater than 5 μm and is equal to or smaller than 100 μm. When the filler having a particle size is included in a translucent resin as the material of the light transforming member, the variation in the chromaticity of the light emitting device can be improved by a light scattering action, and the thermal conductivity and heat-resisting shocking property of the translucent resin can be enhanced. By including the filler in the light transforming member in addition to the fluorescent substance, it is possible to enhance the heat radiating property of the light transforming member. Furthermore, the fluidity of the translucent resin can be regulated to be constant for a long time, and the light transforming member can be formed in a desired place so that the light emitting device can be mass-produced with a high yield. By regulating the mixing rate of the fluorescent substance, the filler and a resin to serves as the binder of the phosphor, it is possible to enhance the heat-resisting shocking property and heat radiating property of the light transforming member.

It is preferable that the filler should have a particle size and/or a shape which are/is similar to those or that of the fluorescent substance. The "similar particle size" in this specification implies the case in which a difference between the respective central particle sizes of the particles is smaller than 20%, and the similar shape implies the case in which a difference in the value of degree of roundness representing the extent of an approximation to the complete roundness of each particle size (the degree of roundness=the peripheral length of a complete round which is equal to the projected area of a particle/the peripheral length of the projection of the particle) is smaller than 20%. By using such a filler, the fluorescent substance and the filler act each other and the fluorescent substance can be dispersed well in a resin so that a color unevenness can be suppressed.

For example, in both the fluorescent substance and the filler, central particle sizes can be set to be 15 μm to 50 μm, and more preferably, 20 μm to 50 μm. By regulating the particle size, it is possible to provide an interval between the particles. Consequently, it is possible to maintain a light fetch path and to improve a directional characteristic while suppressing a reduction in a luminous intensity due to the containment of the filler.

Manufacturing Method

Another aspect according to the invention relates to a method of manufacturing the light emitting device. FIGS. 5 to 10 are sectional views showing an example of the flow of the manufacturing method.

Figure 5:
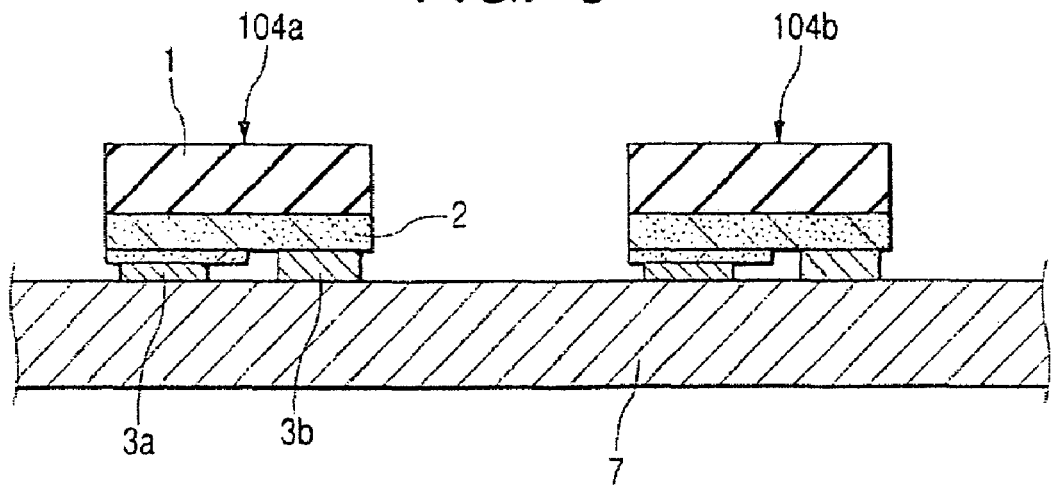
FIG. 5 is a sectional view showing a step in a method of manufacturing a light emitting device according to a third embodiment of the invention.

In the method, a semiconductor light emitting unit may be fabricated by an ordinary method, and semiconductor light emitting units 104a and 104b may be arranged on an adhesive sheet 7 as shown in FIG. 5. The semiconductor light emitting units 104a and 104b and the adhesive sheet 7 are bonded to each other in such a manner that a positive electrode 3a and a negative electrode 3b of each of the semiconductor light emitting units 104a and 104b are opposed to the bonding surface of the adhesive sheet 7.

Figure 6:
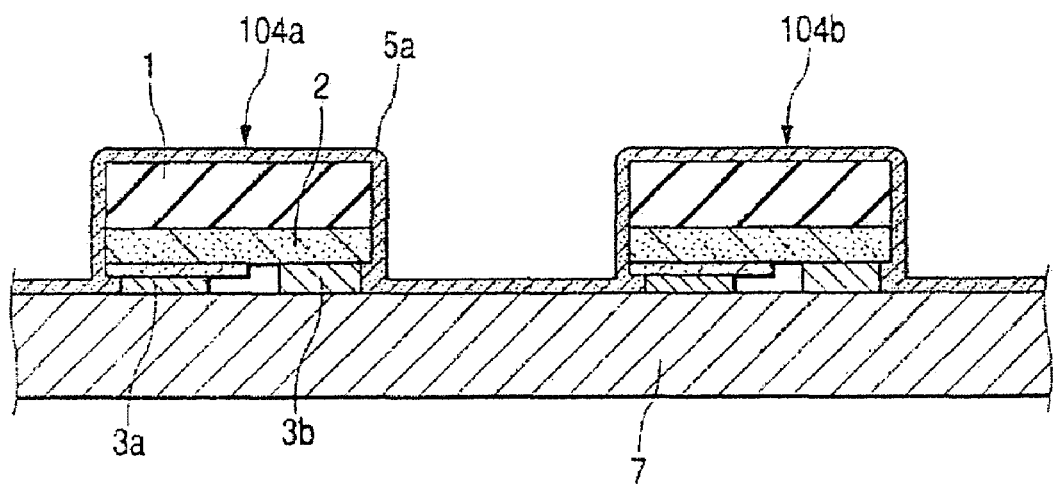
FIG. 6 is a typical sectional view showing a step in the method of manufacturing a light emitting device according to the third embodiment.

As shown in FIG. 6, next, an $SiO_2$ film having a thickness of approximately 2000 angstroms (Å) is formed by sputtering on the light emitting surface (the surface of a translucent substrate 1) and a side surface in each of the semiconductor light emitting units 104a and 104b, for example. An aluminum film having a thickness of 1000 Å to 3000 Å is formed thereon by the sputtering so that a shielding film 5a is formed. Consequently, the shielding film 5a covering the side surfaces and the light emitting surfaces (the surface of the translucent substrate 1) excluding a mounting surface on a semiconductor side opposed to the adhesive sheet 7 is formed in the semiconductor light emitting units 104a and 104b.

The thickness of the shielding film 5a is set to be 1000 Å to 10000 Å in the side surface portions of the semiconductor light emitting units 104a and 104b. Preferably, a thickness of 1000 Å to 3000 Å is set. The thickness within this range can substantially eliminate a light transmitted through the side surface portion of the semiconductor light emitting unit and furthermore, can prevent the shielding film from being peeled.

Figure 7:
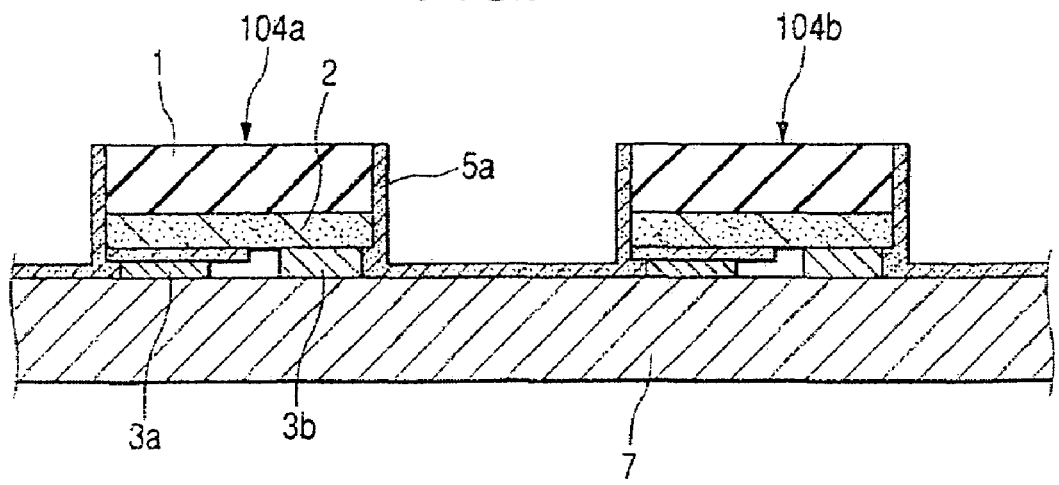
FIG. 7 is a typical sectional view showing a step in the method of manufacturing a light emitting device according to the third embodiment.

After the shielding film 5a is formed, the shielding film 5a formed on the light emitting surfaces of the semiconductor light emitting units 104a and 104b is removed by polishing as shown in FIG. 7. The semiconductor light emitting units 104a and 104b then are separated from the adhesive sheet 7. By the foregoing method, the semiconductor light emitting units 104a and 104b having the shielding film 5a formed on the side surfaces are fabricated.

Next, a substrate (a submount substrate) 32a for mounting the semiconductor light emitting unit is prepared. A wiring electrode 31 is formed on one of the main surfaces of the substrate 32a. For a conductive member to form the wiring electrode 31, aluminum, silver, gold or their alloys having high reflectances should be used. It is preferable to use the material of a substrate for a submount having a coefficient of thermal expansion which is almost equal to that of the material of each of the semiconductor light emitting units 104a and 104b. For example, aluminum nitride may be used as a nitride type semiconductor light emitting unit. Consequently, it is possible to reduce a strain caused by a difference in a thermal expansion in a connecting portion. Thus, it is possible to enhance the reliability of a light emitting device.

Figure 8:
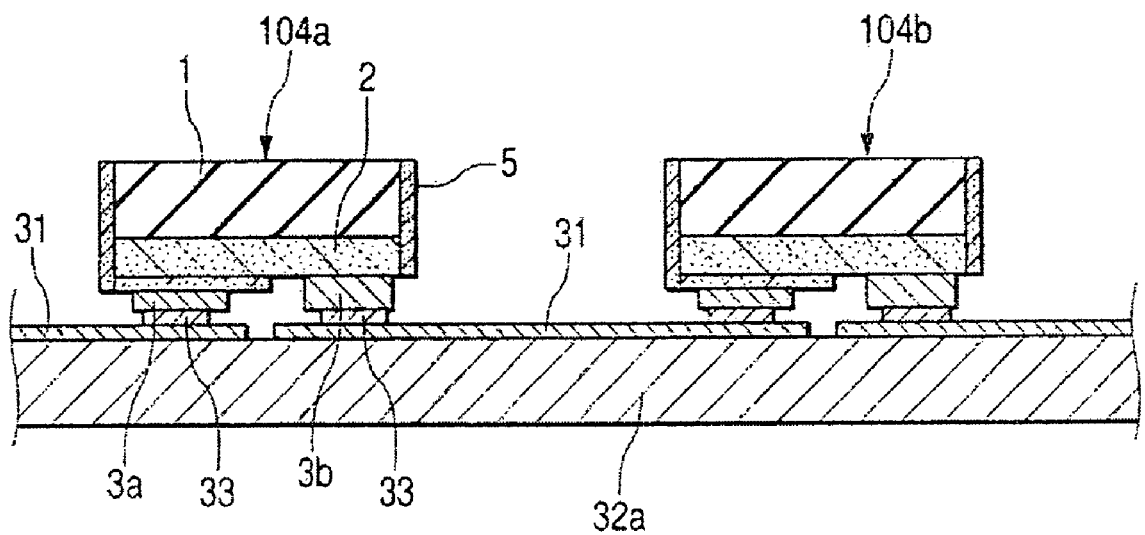
FIG. 8 is a typical sectional view showing a step in the method of manufacturing a light emitting device according to the third embodiment.

In manufacturing method, the semiconductor light emitting units 104a and 104b may be arranged and mounted on the substrate 32a as shown in FIG. 8. Both of the positive and negative electrodes of each of the semiconductor light emitting units 104a and 104b are fixed to be electrically conducted to corresponding wiring electrodes through a bump 33, respectively. More specifically, the bump 33 formed of Au is provided in portions placed on the wiring electrode 31 which are opposed to both of the positive and negative electrodes 3a and 3b of each of the semiconductor light emitting units 104a and 104b. Next, the positive and negative electrodes 3a and 3b of each of the semiconductor light emitting units 104a and 104b and the wiring electrode 31 of the submount 32a are opposed to each other through the bump 33 respectively, and a load, a heat and an ultrasonic wave are applied to weld the bump 33 so that the positive and negative electrodes 3a and 3b of each of the semiconductor light emitting units 104a and 104b and the wiring electrode 31 are bonded to each other. For the material of the bump 33, it is also possible to use an eutectic solder (Au—Sn), Pb—Sn and a lead-free solder in addition to Au.

In this case, a portion between the positive and negative electrodes 3a and 3b of each of the semiconductor light emitting units 104a and 104b and the separating portion of the wiring electrode 31 on the submount side should be filled with an underfill formed of an insulator in order to enhance an insulating property between the positive and negative electrodes and to improve a reliability. Examples of the material of the underfill include a thermosetting resin such as an epoxy resin.

Figure 9:
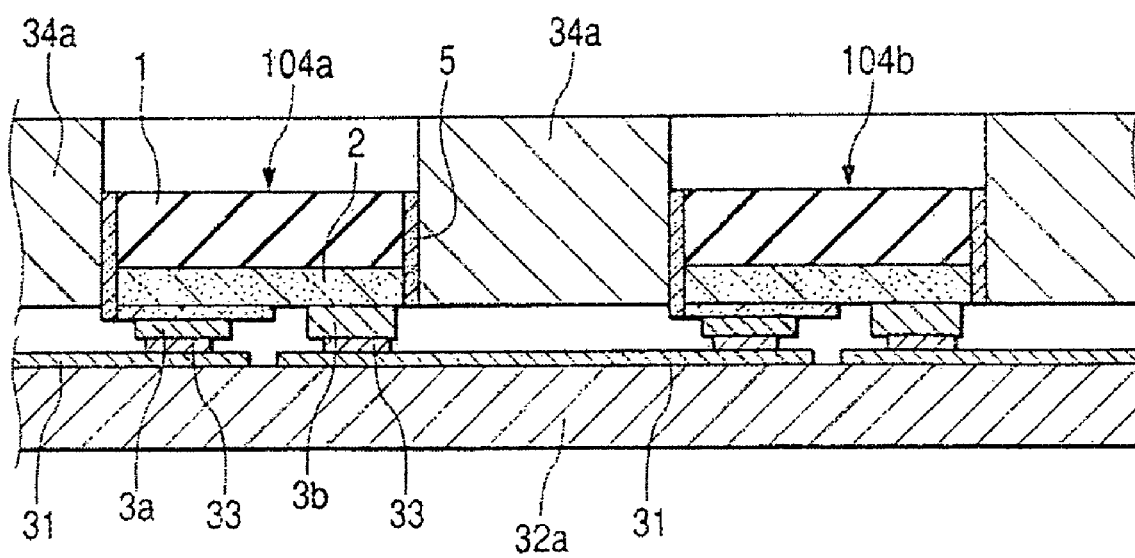
FIG. 9 is a typical sectional view showing a step in the method of manufacturing a light emitting device according to the third embodiment.

As shown in FIG. 9, a screen plate 34a is provided opposite to the substrate 32a from the translucent substrate 1 side in each of the semiconductor light emitting units 104a and 104b. The screen plate 34a has such a structure that only the light emitting surface of the semiconductor light emitting unit is opened and other portions are masked.

Figure 10:
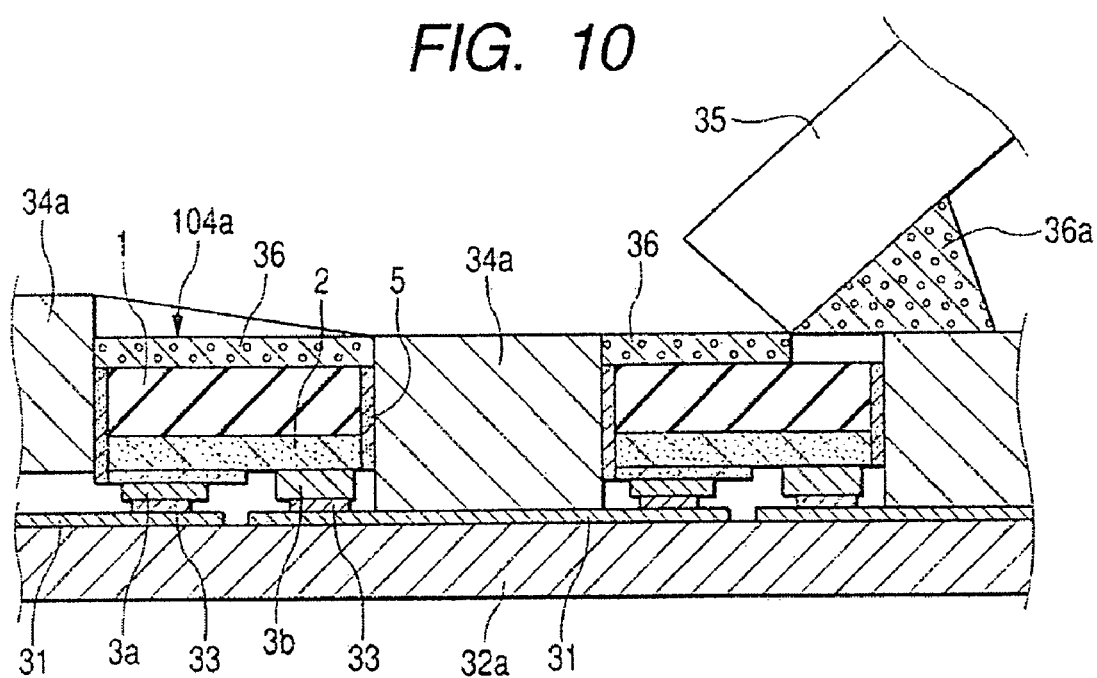
FIG. 10 is a typical sectional view showing a step in the method of manufacturing a light emitting device according to the third embodiment.
Figure 11:
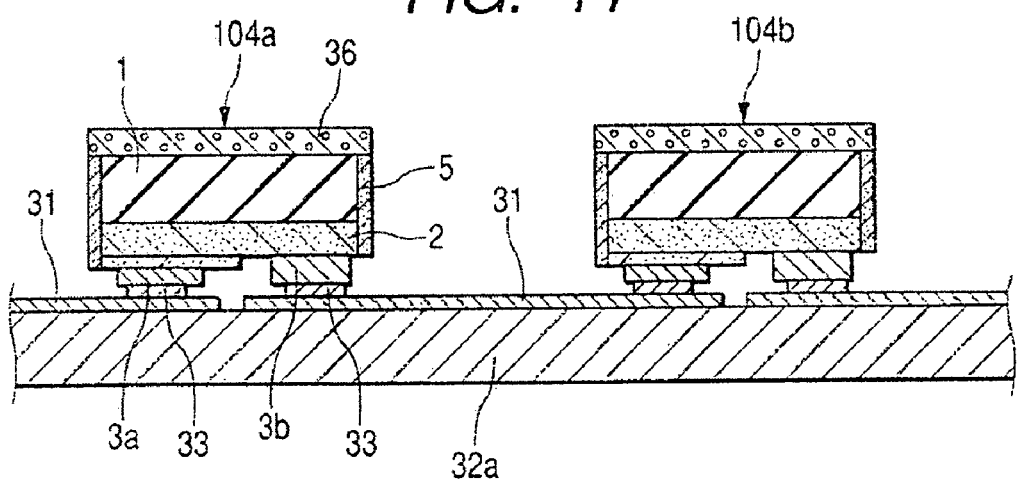
FIG. 11 is a typical sectional view showing a step in the method of manufacturing a light emitting device according to the third embodiment.

Then, a phosphor-containing paste 36a, obtained by dispersing a phosphor into a silicone resin, is subjected to screen printing by using a squeegee 35 as shown in FIG. 10. By the steps described above, the phosphor-containing paste 36a is formed on the light emitting surfaces of the semiconductor light emitting units 104a and 104b as shown in FIG. 11. When the phosphor-containing paste 36a is cured, and a phosphor layer 36 is formed.

In a light emitting device 200 manufactured by the foregoing method, light emitted from the side surfaces of the semiconductor light emitting units 104a and 104b is reflected by the shielding film 5a. For this reason, the light is not irradiated on the light transforming member 36 covering the semiconductor light emitting units 104a and 104b that are adjacent to the semiconductor light emitting units 104a and 104b. By the foregoing method, it is possible to manufacture a light emitting device having a clear boundary between light distribution patterns and a high reliability.

The light emitting device fabricated by the foregoing manufacturing method may have the same structure as the light emitting device according to each of the first and second embodiments except that the light reflecting layer 5a covering the side surfaces of the semiconductor light emitting units 104a and 104b is formed in place of the shielding member according to each of the first and second embodiments.

As described above, in the manufacturing method, the shielding member can be set to be the shielding film having the insulating member covering the side surfaces of the semiconductor light emitting unit and the light reflecting layer formed by a metallic material covering the insulating member.

A predetermined portion in the semiconductor light emitting unit may be masked, and the shielding film can be formed on the side surfaces of the semiconductor light emitting unit, for example, by sputtering or vapor deposition.

For the specific material of the light reflecting layer, it is possible to use a silver white metal having a high reflectance, for example, aluminum, silver, rhodium or a metal film containing at least one of them and an insulating film such as silicon dioxide. Consequently, light emitted from the semiconductor light emitting unit is efficiently reflected by the shielding film and is emitted toward the light transforming member covering the semiconductor light emitting unit. Accordingly, it is possible to enhance the shielding property of the shielding member and to increase a wavelength conversion efficiency obtained by the optical transforming member.

If the shielding film includes a metal film, it is preferable that the metal film should be formed on the side surfaces of the semiconductor light emitting unit through a thin film constituted by an insulating material such as silicon dioxide, aluminum oxide, aluminum nitride or their mixtures. Consequently, it is possible to prevent a short circuit of the semiconductor light emitting unit from being caused by the metal film. Thus, it is possible to obtain a light emitting device having a high reliability.

EXAMPLE

An example according to the invention will be described below in detail. The invention is not restricted to the following example.

The light emitting device shown in FIG. 1 was fabricated.

In the light emitting device according to the example, the semiconductor light emitting unit uses, as an active layer, a nitride semiconductor unit having an $In_{0.2}Ga_{0.8}N$ semiconductor in a wavelength of 460 nm in which a monochromatic light emission peak is a visible light.

A description will be given in more detail. A nitride semiconductor light emitting unit (an LED chip) can be fabricated by causing a TMG (trimethyl gallium) gas, a TMI (trimethylindium) gas, a nitrogen gas and a dopant gas to flow together with a carrier gas over a sapphire substrate which is washed, and forming a nitride semiconductor by an MOCVD method. $SiH_4$ and $Cp_2Mg$ are switched as the dopant gas to grow layers to be an n-type nitride semiconductor and a p-type nitride semiconductor.

For the element structure of the LED chip according to the example, a GaN layer to serve as an undoped nitride semiconductor, an n-type GaN layer to serve as an n-type contact layer having an Si doped n-type electrode formed thereon, and a GaN layer to serve as an updoped nitride semiconductor are laminated on a sapphire substrate to serve as a translucent substrate. A GaN layer to serve as a barrier layer and an InGaN layer to serve as a well layer make one set, and five sets are laminated. A GaN layer to serve ase a barrier layer is finally laminated to serve as an active layer, and the active layer is set to have a multiple quantum well structure. Furthermore, an AlGaN layer to serve as a p-type clad layer doped with Mg and a p-type GaN layer to serve ase a p-type contact layer doped with Mg are sequentially laminated on the active layer. A GaN layer is formed on the sapphire substrate at a low temperature so as to serve as a buffer layer. The p-type semiconductor is annealed at 400° C. or higher after formation of the film.

After the semiconductor layer is grown as described above, each of the surfaces of the p-type contact layer and the n-type contact layer is exposed at the same surface side of the nitride semiconductor on the sapphire substrate by etching. Subsequently, sputtering using ITO (a composite oxide of indium and tin) as a material is carried out over the p-type contact layer so that a diffusion electrode is provided on almost the whole surface of the p-type contact layer exposed like a stripe. By forming such an electrode, it is possible to cause a current flowing in the diffusion electrode to cover the wide area of the p-type contact layer and to enhance the luminous efficiency of the LED chip.

Furthermore, sputtering using W, Pt and Au is carried out sequentially, and layers are laminated on a part of a diffusion electrode 205 and the n-type contact layer to form a p-side seating electrode 204 and an n-side seating electrode 202. Finally, a wafer having a semiconductor laminated thereon is changed into a chip by dicing so that an LED chip 201 of □=1 mm×1 mm is obtained.

Figure 4:
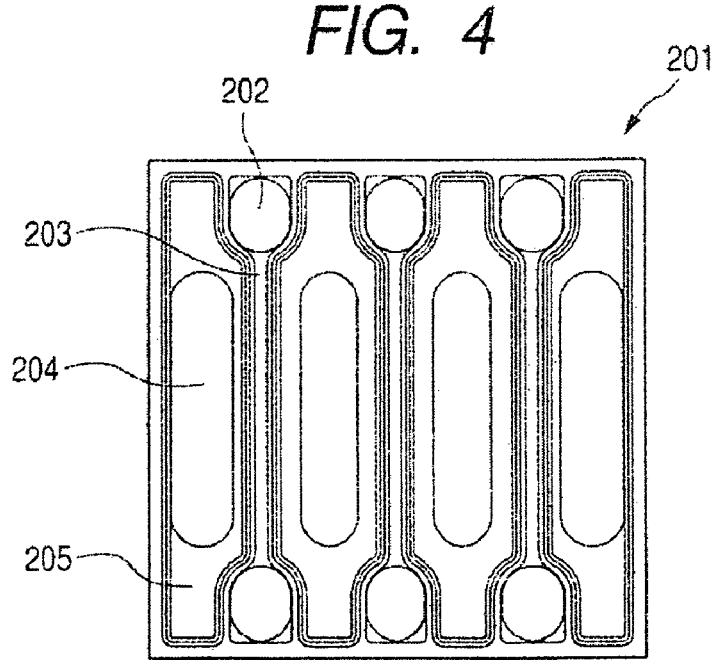
FIG. 4 is a top view showing a semiconductor light emitting unit according to an example of the invention.

FIG. 4 is a top view showing the LED chip 201 according to the example.

In the LED chip 201 according to the example, the n-type seating electrode 202 is formed in both corner portions of an n-type semiconductor 203 exposed like a stripe, that is, two opposed sides in the LED chip 201. The n-type semiconductor 203 exposed by etching has a constricted portion which is narrowed from the position of the corner portion on which the n-type seating electrode 202 is formed toward the center of the LED chip 201 as seen from the upper surface of the LED chip 201. An extended portion is provided to connect a pair of constricted portions which are opposed to each other. A p-side semiconductor layer, the diffusion electrode 205 or the p-side seating electrode 204 is formed in such a position as to interpose the extended portion.

The support substrate 103 shown in FIG. 1, which is used in the example, is provided with a conductor wiring using Au for the material of aluminum nitride. For the conductor wiring, a pair of positive and negative conductor wirings are opposed to the p-side seating electrode 204 and the n-side seating electrode 202 of the light emitting unit through a bump, respectively. The light emitting unit has the p-side and n-side seating electrodes opposed to the conductor wirings through an Au bump. Furthermore, a load, an ultrasonic wave and a heat are applied to weld the bump, thereby bonding the light emitting unit to the conductor wiring of a submount. In this case, an interval between the semiconductor light emitting units is set to be approximately 100 μm. The two semiconductor light emitting units according to the example are connected to the conductor wirings in such a manner that they can be independently driven respectively, that is, can be caused to emit a light one by one or at the same time. As described above, the main elements of the light emitting device according to the example are fabricated.

In a procedure for fabricating the light emitting device according to the example, the semiconductor light emitting unit 104 is mounted and the shielding member 102 is formed therearound. The light transforming member 101 then is formed on the main surface at the light emission observing side of the semiconductor light emitting unit 104. A method of forming the light transforming member 101 and the shielding member 102 will be described below in detail.

The shielding member may be formed by providing a silicone resin containing a diffusing agent and a white pigment around the semiconductor light emitting unit through screen printing and curing the silicone resin. For the material of the shielding member according to the example, the silicone resin is caused to contain the white pigment and the diffusing agent and is stirred by means of a rotation and revolution mixer to prepare a mixture of the white pigment, the diffusing agent and the silicone resin which is to be used. The shielding member according to the example is formed in a thickness of 100 μm and a width of 100 μm in order to surround the contour of the semiconductor light emitting unit. The thickness of the welded bump is set to be 20 to 25 μm and the thickness of the LED chip is set to be 70 μm, and the upper surface of the side wall of the shielding member is set almost on a level with the upper surface of the LED chip.

For a fluorescent substance, a coprecipitated oxide obtained by coprecipitating, with oxalic acid, a dissolved solution prepared by dissolving rare earth elements of Y, Gd and Ce in acid in a stoichiometric ratio and burning them and aluminum oxide are mixed to acquire a mixed raw material. Furthermore, barium fluoride is mixed as a flux and is then filled in a crucible, and is burned for 3 hours at a temperature of 1400° C. in the air so that a burned product is obtained. The burned product is ground by means of a ball mill in water, and is washed, separated, dried, and finally, sieved to form a $(Y_{0.995}Gd_{0.005})_{2.750}Al_5O_{12}:Ce_{0.250}$ fluorescent substance having a central particle size of 8 μm. For the material of the light transforming member, a silicone resin is caused to contain 20 to 75 wt % of the fluorescent substance and is stirred for 5 minutes by means of the rotation and revolution mixer to obtain a mixture of a phosphor and the silicone resin to be a binder. Furthermore, the mixture is subjected to the screen printing over a sapphire substrate surface to be a main surface on the light emission observing side of a semiconductor light emitting unit which is flip chip mounted and is then cured. Thus, the light shielding films 101a and 101b are formed. The light transforming member is provided on each of the semiconductor light emitting unit 104a and the semiconductor light emitting unit 104b, and an interval which is almost equal to the interval between the semiconductor light emitting units is formed between the light transforming member provided on the semiconductor light emitting unit 104a and the light transforming member provided on the semiconductor light emitting unit 104b.

In the light emitting device 100 according to the example, part of the light emitted from the light emitting unit 104a is reflected by the shielding member 102 and is irradiated on only the region of the light transforming member 101 which covers the light emitting unit 104a. Consequently, the light is not irradiated on the light transforming member covering the light emitting unit 104*b*. According to the example, therefore, it is possible to obtain a light emitting device having a clear boundary between light distribution patterns and a high reliability.

In various implementations, the invention may provide a light emitting device having excellent optical characteristics and can be utilized as the light source of a lighting unit for a vehicle that requires a predetermined light distribution pattern.

What is claimed is:

1. A light emitting device comprising:
a plurality of semiconductor light emitting units each having a translucent substrate thereon, the semiconductor light emitting units configured to emit light,
a plurality of light transforming members each containing a fluorescent substance and each disposed on a corresponding one of the semiconductor light emitting units so as to be in contact with the translucent substrate, wherein each of the light transforming members absorbs at least a part of the light emitted from the corresponding one of the semiconductor light emitting units so as to emit light having a different wavelength; and
a shielding member including concave regions that conform with a shape of each semiconductor light emitting unit, wherein each semiconductor light unit is housed in a corresponding one of the concave regions such that the shielding member circumferentially surrounds each of the semiconductor light units.

2. The light emitting device according to claim 1 comprising a support substrate on which the semiconductor light emitting units are mounted, the semiconductor light emitting units having a pair of positive and negative electrodes on the same plane side and mounted such that the positive and negative electrodes are connected to a conductor wiring of the support substrate though a conductive member.

3. The light emitting device according to claim 1, wherein the shielding member is disposed on or applied to a support substrate such that an upper surface thereof is higher than a light emitting surface of the semiconductor light emitting unit.

4. The light emitting device according to claim 1, wherein the shielding member is disposed on or applied to a support substrate such that an upper surface thereof is provided on almost a level with a light emitting surface of the semiconductor light emitting unit.

5. The light emitting device according to claim 1 or 2, wherein the shielding member includes an insulating member covering a side surface of the semiconductor light emitting unit and including a light reflecting layer on the insulating member.

6. The light emitting device according to claim 5, wherein the shielding member includes a diffusing material in a resin material.

7. The light emitting device according to claim 1 or 2, wherein the shielding member includes a diffusing material in a resin material.

8. The light emitting device according to claim 7, wherein the diffusing material contains at least one material selected from the group consisting of barium sulfate, barium titanate, titanium oxide, aluminum oxide and silicon oxide.

9. The light emitting device according to claim 1 further comprising an antireflection film on the translucent substrate.

10. The light emitting device according to claim 1 wherein the translucent substrate of each light emitting unit is between an active layer of the corresponding light emitting unit and the corresponding light transforming member.

11. A light emitting device comprising:
a plurality of semiconductor light emitting units each comprising:
a translucent substrate having a first surface and a second surface opposite to the first surface;
an active layer for emitting light on the first surface of the translucent substrate;
an antireflection film on the translucent substrate; and
a phosphor layer on the second surface of the translucent substrate, wherein the phosphor layer absorbs at least a part of the light emitted from the active layer so as to emit light having a different wavelength,
wherein a light shielding film surrounds a side surface of each semiconductor light emitting unit.

* * * * *